United States Patent
Yamaji et al.

(10) Patent No.: US 10,802,303 B2
(45) Date of Patent: Oct. 13, 2020

(54) OPTICAL MODULE HAVING WIRING AND BRIDGE SUBSTRATES FOR MODULATION SIGNALS

(71) Applicants: SUMITOMO ELECTRIC DEVICE INNOVATIONS, INC., Yokohama-shi (JP); SUMITOMO ELECTRIC INDUSTRIES, LTD., Osaka-shi (JP)

(72) Inventors: Kazuhiro Yamaji, Yokohama (JP); Yasushi Fujimura, Osaka (JP); Taichi Misawa, Osaka (JP)

(73) Assignees: Sumitomo Electric Device Innovations, Inc., Yokohama-shi (JP); Sumitomo Electric Industries, Ltd., Osaka-shi (JP)

( * ) Notice: Subject to any disclaimer, the term of this patent is extended or adjusted under 35 U.S.C. 154(b) by 191 days.

(21) Appl. No.: 16/150,327

(22) Filed: Oct. 3, 2018

(65) Prior Publication Data

US 2019/0107739 A1    Apr. 11, 2019

(30) Foreign Application Priority Data

Oct. 5, 2017  (JP) ................................ 2017-194974
May 28, 2018  (JP) ................................ 2018-101402

(51) Int. Cl.
*G02F 1/015*  (2006.01)
*H01S 5/00*  (2006.01)
(Continued)

(52) U.S. Cl.
CPC ............ *G02F 1/015* (2013.01); *H01S 5/0085* (2013.01); *H01S 5/0265* (2013.01);
(Continued)

(58) Field of Classification Search
CPC .. G02F 1/015; G02F 2201/58; G02F 2201/12; G02F 2001/0157; H01S 5/0265;
(Continued)

(56) References Cited

U.S. PATENT DOCUMENTS 7,151,866 B2 * 12/2006 Oikawa ................... G02F 1/125
385/14
9,180,696 B2 * 11/2015 Togo ..................... B41J 13/0009
(Continued)

FOREIGN PATENT DOCUMENTS

JP    2002-280662 A    9/2002
JP    2003-198035 A    7/2003

OTHER PUBLICATIONS

Notice of Allowance issued in U.S. Appl. No. 16/245,303 dated Oct. 15, 2019.
Office Action in U.S. Appl. No. 16/245,303 dated Jun. 28, 2019.

*Primary Examiner* — Andrew Jordan
(74) *Attorney, Agent, or Firm* — Baker Botts L.L.P.; Michael A. Sartori

(57) ABSTRACT

An optical module including a source assembly is disclosed. The source assembly provides a semiconductor optical device, a wiring substrate, and a bridge substrate. The semiconductor optical device includes an electrode and a pad that receives a driving signal therethrough. The wiring substrate, which is arranged side by side with respect to the semiconductor optical device, provides a signal line and a ground line surrounding the signal line. The bridge substrate includes a signal line and a ground line surrounding the signal line. A feature of the optical module is that the bridge substrate is placed on the semiconductor optical device and the wiring substrate such that a transmission line thereof faces the semiconductor optical device and the wiring substrate, and one end of the signal line thereof is connected with the pad of the semiconductor optical device through a
(Continued)

post, and another end of the signal line thereof is connected with an end of the signal line in the wiring substrate through another post.

16 Claims, 28 Drawing Sheets

(51) Int. Cl.
    *H01S 5/026*     (2006.01)
    *H01S 5/022*     (2006.01)
    *H01S 5/40*     (2006.01)

(52) U.S. Cl.
    CPC ...... *H01S 5/02252* (2013.01); *H01S 5/02276* (2013.01); *G02F 2001/0157* (2013.01); *G02F 2201/12* (2013.01); *G02F 2201/58* (2013.01); *H01S 5/02208* (2013.01); *H01S 5/4025* (2013.01)

(58) Field of Classification Search
    CPC ............. H01S 5/02276; H01S 5/02252; H01S 5/0085; H01S 5/02208; H01S 5/4025; H01S 5/005; H01S 5/042
    See application file for complete search history.

(56) References Cited

U.S. PATENT DOCUMENTS

| | | | |
|---|---|---|---|
| 10,527,804 B2 * | 1/2020 | Hara | H01L 24/00 |
| 2005/0089275 A1 * | 4/2005 | Oikawa | G02F 1/125 |
| | | | 385/40 |
| 2012/0128290 A1 | 5/2012 | Han et al. | |
| 2014/0009550 A1 * | 1/2014 | Togo | B41J 29/02 |
| | | | 347/104 |
| 2016/0062063 A1 * | 3/2016 | Ogura | G02B 6/4292 |
| | | | 385/14 |
| 2016/0349470 A1 | 12/2016 | Cheng | |
| 2017/0310078 A1 | 10/2017 | Hirayama | |
| 2018/0123697 A1 | 5/2018 | Kubota et al. | |
| 2019/0107739 A1 * | 4/2019 | Yamaji | H01S 5/02276 |
| 2019/0212508 A1 * | 7/2019 | Hara | H01L 23/49579 |

\* cited by examiner

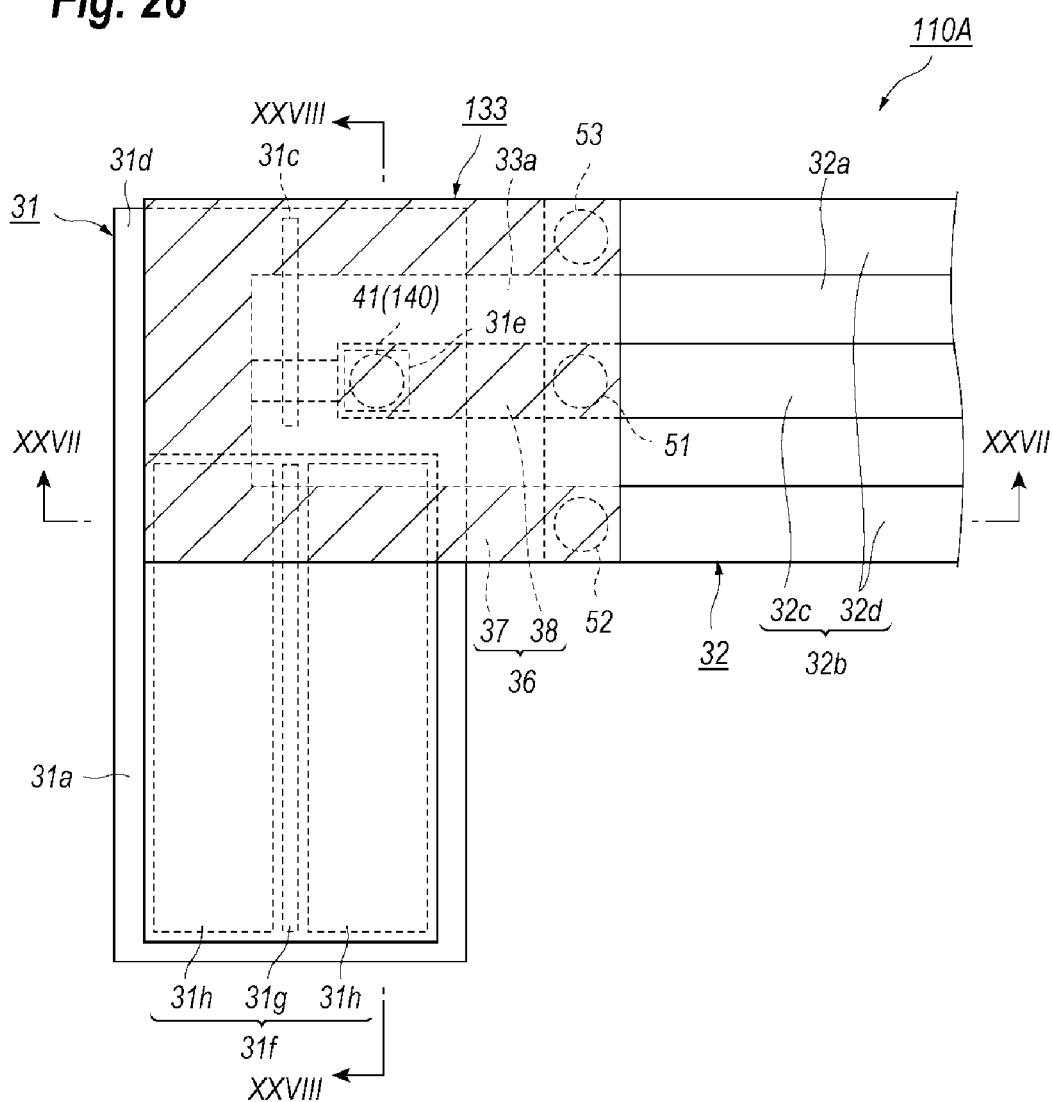

US 10,802,303 B2

OPTICAL MODULE HAVING WIRING AND BRIDGE SUBSTRATES FOR MODULATION SIGNALS

CROSS REFERENCE TO RELATED APPLICATIONS

The present application is based on and claims benefit of Japanese Patent Applications Nos. JP-2017-194974 filed on Oct. 5, 2017 and JP-2018-101402 filed on May 28, 2018, the entire contents of which are incorporated herein by reference.

BACKGROUND OF INVENTION

1. Field of Invention

The present invention relates to an optical module, in particular, an optical module implementing a plurality of semiconductor optical devices each generating optical signals attributed to wavelengths different from each other.

2. Background Arts

A Japanese Patent Application laid open No. JP2003-198035A has disclosed an optical module implementing an LD that emits an optical signal by receiving an electrical signal having frequency components in a radio frequency (RF) range. The optical module disclosed therein provides a pair of planes extending in parallel and providing the first and the second transmission lines respectively. The LD is arranged between the planes as connecting one of electrodes thereof with the first transmission line through a metal block placed between the LD and the first transmission line and another electrode thereof directly with the second transmission.

Another Japanese Patent Application laid open No. JP2002-280662A has disclosed a laser module that integrates an LD with an optical modulator with a type of electro-absorption (EA) modulator, which is often called as an EML, mounted on a substrate such that a top surface of the EML faces the substrate. Electrodes provided in the top surface of the EML are directly in contact with electrodes provided on the substrate.

In order to operate an optical module in high speed, the EML in the optical modulator thereof is provided with a modulation signal through a transmission line with short as possible to suppress degradation in signal quality at high frequencies. When a transmission line that carries the modulation signal is connected with the EML by bonding wires, the quality of the modulation signal is possibly degraded due to parasitic components inherently attributed to the boding wires. Other techniques to electrically connect the transmission line with the EML have been requested in the field.

SUMMARY OF INVENTION

An aspect of the present invention relates to an optical module that includes a semiconductor optical device, a wiring substrate, and a bridge substrate, where a modulation signal is provided to the semiconductor optical device through the wiring substrate and the bridge substrate. The semiconductor optical device provides an electrode and a pad for an optical modulator, where the electrode receives a modulation signal through the pad. The wiring substrate is arranged in side by side with respect to the semiconductor optical device. The wiring substrate, which is arranged side by side with respect to the semiconductor optical device, provides a transmission line that carries the modulation signal to the semiconductor optical device. The transmission line includes a signal line and a ground metal surrounding the signal line. The bridge substrate provides a transmission line including a signal line that carries the modulation signal to the semiconductor optical device and a ground metal surrounding the signal line of the bridge substrate. The bridge substrate is placed on the semiconductor optical device and the wiring substrate as the transmission line thereof faces the transmission line of the wiring substrate and the pad of the semiconductor optical device. A feature of the optical module of the present invention is that the signal line of the bridge substrate in one end thereof is connected with the pad of the semiconductor optical device, while, in another end thereof is connected with an end of the signal line of the wiring substrate.

BRIEF DESCRIPTION OF THE DRAWINGS

Embodiment of the invention will be apparent from the following detailed description and the appended claims and drawings in which:

FIG. 25A is a plan view schematically showing a conventional source assembly, while.

FIG. 26 is a plan view showing another conventional source assembly shown in FIG. 25A;

DETAILED DESCRIPTION

Figure 1:
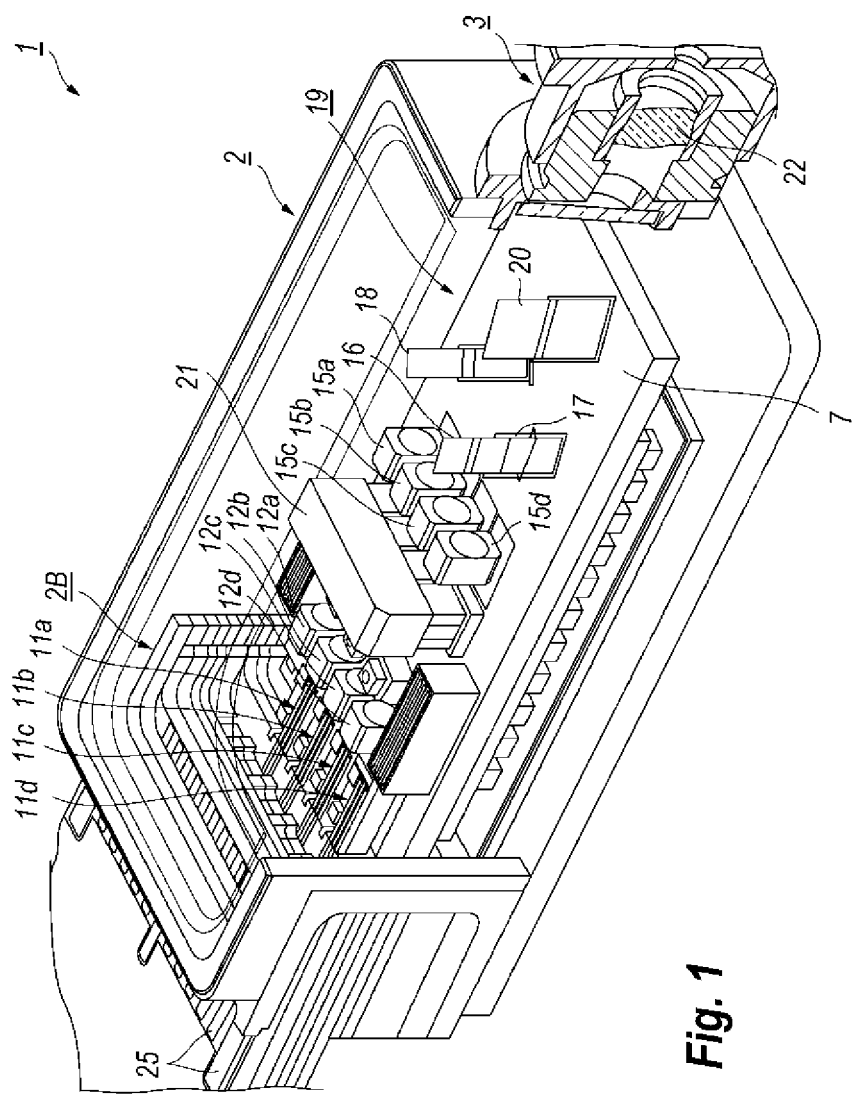
FIG. 1 is a perspective view shown a primary portion of an optical module according to embodiment of the present invention.

Next, embodiment according to the present invention will be described as referring to the drawings. However, the present invention is not restricted to the embodiment, and has a scope indicated in claims attached and all modifications thereof within a range equivalent thereto. Also, in the description of the drawings, numerals or symbols same with or similar to each other will refer to elements same with or similar to each other without duplicating explanations.

Figure 2:
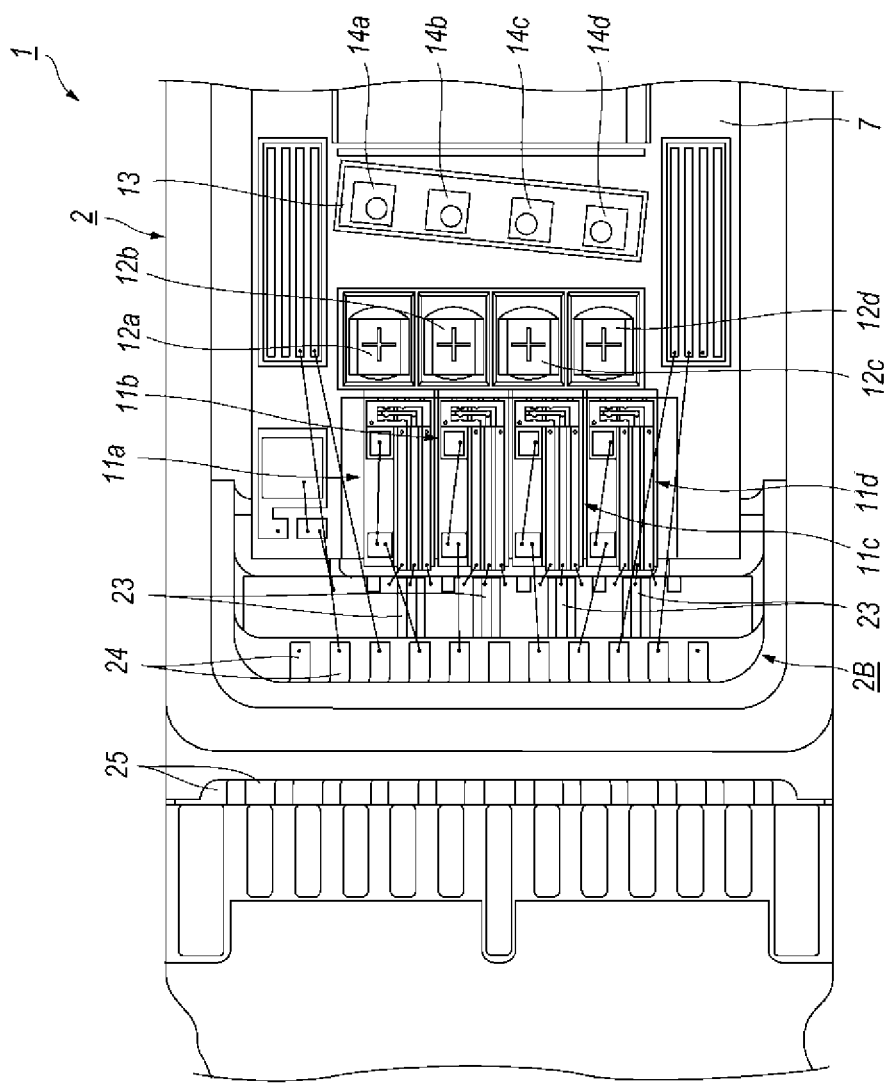
FIG. 2 is a plan view that magnifies a primary portion of the optical module.

FIG. 1 is a perspective view showing a primary portion of an optical module 1 according to embodiment of the present invention; and FIG. 2 is a plan view magnifying a primary portion of the optical module 1. The optical module 1 of the embodiment is a type of a transmitter optical sub-assembly (TOSA) providing a box shaped housing 2 and an optical coupling portion 3 with a cylindrical shape. The optical module 1 installs N counts of source assemblies, 11a to 11d, N counts of first lenses, 12a to 12d, a beam splitter (BS) 13, N counts of photodiodes (PDs), 14a to 14d, N counts of second lenses, 15a to 15d, and an optical multiplexing system 19, where N is an integer greater than unity (1). The present optical module 1 provides four (N=4) lanes for the optical signals. Those components of the source assemblies, 11a to 11d, the first lenses, 12a to 12d, the BS 13, the second lenses, 15a to 15d, an optical isolator 21, and the optical multiplexing system 19 are mounted on a top surface of a carrier 7.

The housing 2 provides a feedthrough 2B that pierces a rear wall of the housing 2. In the description below, a direction of "rear" or "back" assumes a side where the feedthrough 2B is provided; while, another direction of "forward" or "front" corresponds to a side where the optical coupling portion 3 is provided. However, those definitions of the directions are merely for explanation sake, and could not affect the scope of the present invention. The feedthrough 2B provides terminals 25 that electrically connect elements within the housing with external apparatuses. Specifically, the feedthrough 2B in a portion inside of the housing 2 provides terminals 24 and N counts of signal lines 23, where those terminals 24 and the signal lines 23 are connected with terminals 25 on the feedthrough 2B in a portion outside of the housing 2.

The source assemblies, 11a to 11d, may be driven independently and generate optical signals attributed to wavelengths different from each other. The driving signals, which are provided to the source assemblies, 11a to 11d, from the outside of the housing 2, are modulated with high frequencies. Details of the source assemblies, 11a to 11d, will be described later in the present specification. The first lenses, 12a to 12d, which are optically coupled with the source assemblies, 11a to 11d, may convert the optical signals in respective quasi-collimated beams.

The BS 13, which has a rectangular shape extending along a direction intersecting optical axes of the source assemblies, 11a to 11d, is disposed between the first lenses, 12a to 12d, and the second lenses, 15a to 15d. The BS 13 provides multi-layered dielectric films whose normal intersects with the optical axes of the source assemblies, 11a to 11d. The BS 13 may split the optical signals output from the first lenses, 12a to 12d, into respective two portions.

The PDs. 14a to 14d, which are mounted on the BS 13, may detect power of the optical signals by receiving respective one of portions of the optical signals split by the BS 13. Specifically, the PDs, 14a to 14d, are mounted on the BS 13 such that beam entering surfaces thereof face the top of the BS 13, where the PDs, 14a to 14d, receive the optical signals split by the BS 13 by the respective beam entering surfaces. The second lenses, 15a to 15d, optically couple with the first lenses, 12a to 12d, via the BS 13. The optical signals output from the first lenses, 12a to 12d, pass the BS 13, form respective beam waists, expand field diameters thereof, and enter the optical isolator 21. The optical isolator 21 pass the optical beams coming from the BS 13 but cut optical signals advancing the source assemblies, 11a to 11d, reflected by the second lenses, 15a to 15d. The optical signals passing the optical isolator 21 enter the second lenses, 15a to 15d.

The optical multiplexing system 19, which is optically coupled with the second lenses, 15a to 15d, multiplexes the optical signals output from the second lenses, 15a to 15d. The optical multiplexing system 19, as shown in FIG. 1, includes a first wavelength division multiplexing (WDM) filter 16, a second WDM filter 17, a mirror 18, and a polarization dependent combiner (PDC) 20. The mirror 18 optically couples with the second lenses, 15a and 15b; specifically, the mirror 18 in a light-reflecting surface thereof exists on an intersection between optical axes of second lenses, 15a and 15b, and makes a substantial angle with respect to those optical axes. The first WDM 16 optically couples with the second lens 15c, specifically; the first WDM 16 in a surface thereof having a function of the wavelength selection exists on the optical axis of the second lens 15c and makes a substantial angle thereto. The first WDM filter 16 may transmit the optical signal coming from the second lens 15c but reflect another optical signal coming from the second lens 15a reflected by the mirror 18. Two optical signals coming from the second lenses, 15a and 15c, passing the first WDM filter 16 align the respective optical axes to each other, thus, the first WDM filter 16 may multiplex the two optical signals.

The second WDM filter 17 optically couples with the second lens 15d. Specifically, the second WDM filter 17 in a surface having the function of the wavelength selection exists on an optical axis of the second lens 15d, but makes a substantial angle thereto. The second WDM filter 17 may transmit the optical signal coming from the second lens 15d but reflects another optical signal coming from the second lens 15b and reflected by the mirror 18. Thus, two optical signals coming from the second lenses, 15b and 15d, align respective optical axes by the second WDM filter 17. That is, the second WDM filter 17 may multiplex two optical signals coming from the second lenses, 15b and 15d. The PDC 20, which may be made of transparent slab, multiplexes the optical signals passing the first WDM filter 16 with the optical signals passing the second WDM filter 17. The four optical signals finally multiplexed by the PDC 20 may externally output through a window providing in the front wall of the housing 2.

The coupling portion 3, which may have a cylindrical shape, includes a lens 22 and a fiber stub. The lens 22 optically couples with the optical multiplexing system 19. Although not illustrated in the drawings, the fiber stub 19 secures a coupling fiber in a center thereof. The lens 22 concentrates the optical signals output from the PDC 20 onto an end of the coupling fiber. The coupling portion 3, which is optically aligned with the optical signals coming from the PDC 20, is welded to the front wall of the housing 2. The coupling portion 3 may further include an optical isolator therein.

Figure 3:
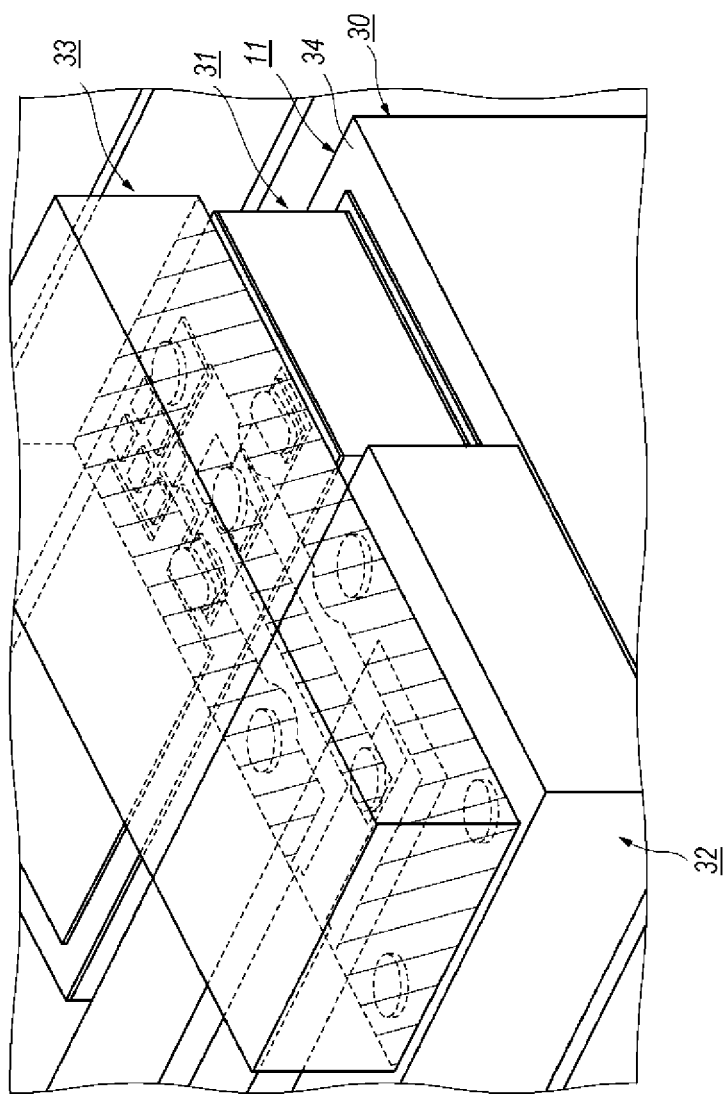
FIG. 3 is a perspective view magnifying one of the source assemblies.
Figure 4:
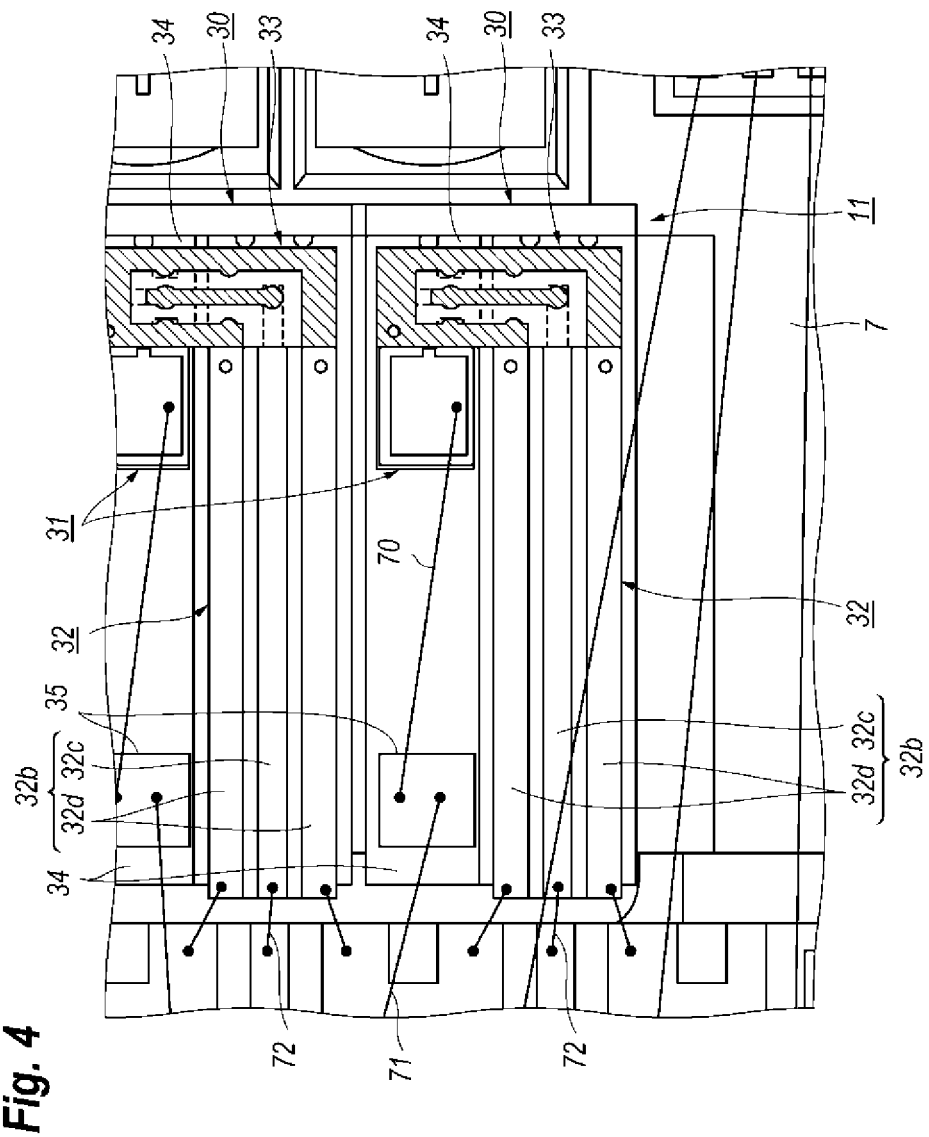
FIG. 4 is a plan view magnifying the source assembly.

FIG. 3 is a perspective view magnifying one of the source assembly 11a, where the source assemblies, 11a to 11d, may be collectively called as a source assembly 11; FIG. 4 is a plan view magnifying the source assembly 11. The source assembly 11 includes a chip carrier 30, a semiconductor optical device 31, a wiring substrate 32, and a bridge substrate 33. The chip carrier 30, which may be made of electrically insulating material, is mounted on the carrier 7, and mounts the semiconductor optical device 31 on a ground metal 34 provided on a top of the chip carrier 30; thus, a back metal of the semiconductor optical device 30 faces to and in contact with the ground metal 34.

The ground metal 34 also mounts a bypassing capacitor 35 thereon, where the bypassing capacitor 35 may be a type of die-capacitor with electrodes in top and back surfaces thereof. The capacitor 35 in a back metal thereof is in contact with the ground metal 34 through an adhesive. The bypassing capacitor 35 in a top electrode thereof is connected to the semiconductor optical device 31 through a bonding wire 70 and one of terminals 24 provided on the feedthrough 2B via a bonding wire 71.

Figure 5:
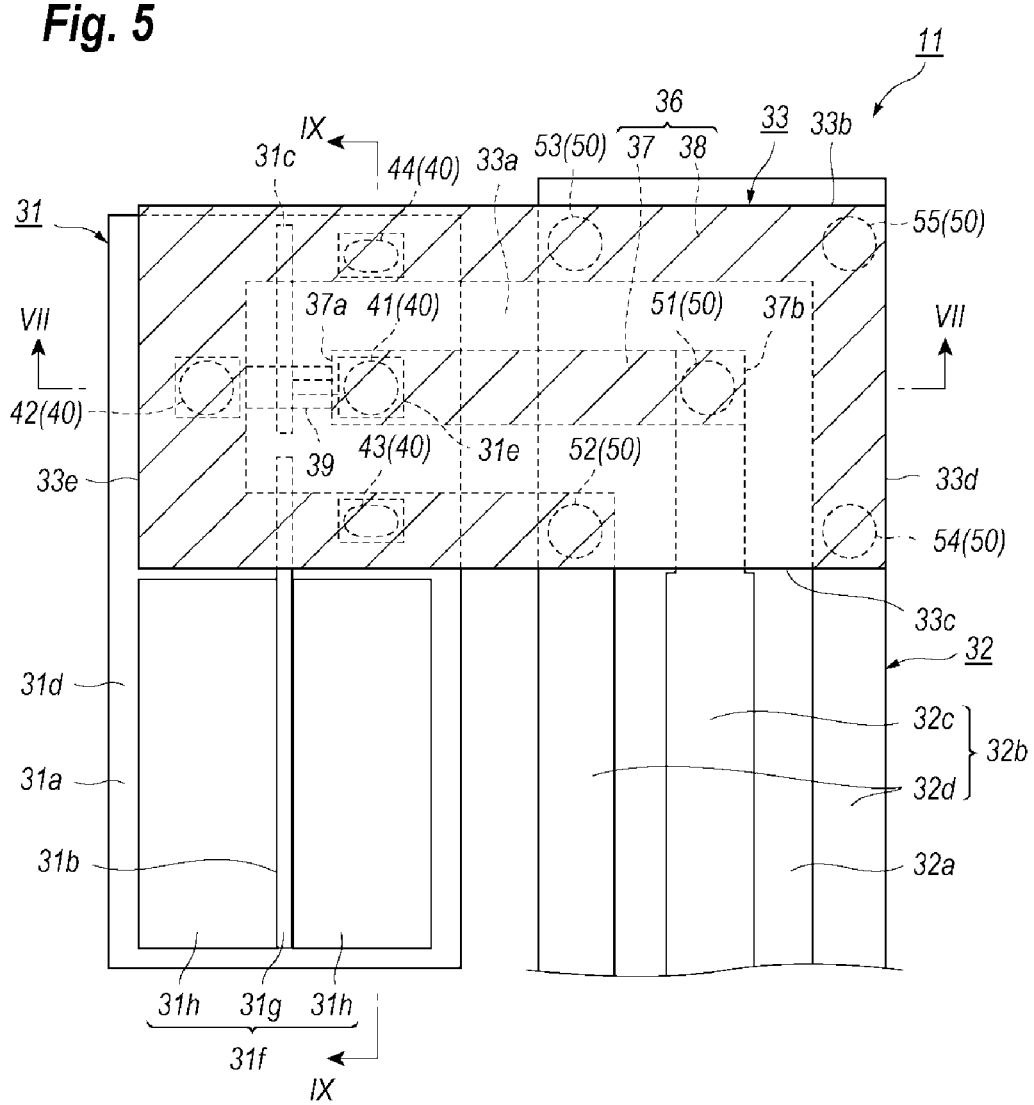
FIG. 5 is a plan view of the source assembly, where FIG. 5 omits the chip carrier.

FIG. 5 is a plan view of the source assembly 11, where FIG. 5 omits the chip carrier 30. The semiconductor optical device 31, which extends along a longitudinal direction of the housing 2, may integrate a semiconductor laser diode (LD) with a semiconductor optical modulator, for instance, type of electro-absorption (EA) modulator on a common substrate; accordingly, the semiconductor optical device 31 may be hereinafter called as an EML. The EML 31 provides a top surface 31a, an anode 31b of the LD, and another anode 31c for the modulator in the top surface 31a, a portion of which is covered with an insulating film 31d, which may be made of silicon nitride (SiN). The anode 31b for the LD is provided in a lateral center of the top surface 31a and on a laser cavity of the LD. The anode 31c of the modulator is provided also in a lateral center of the top surface 31a and on an extension of the anode 31b in the LD.

The EML 31 also provides in the top surface 31a thereof a signal pad 31e connected with the anode 31c of the modulator and another pad 31f connected with the anode 31b of the LD, where the former pad 31e is disposed side by side with respect to the anode 31c of the modulator, while the latter pad 31f is arranged side by side with respect to the anode 31c and the pad 31e of the modulator. The pad 31f, which may supply a bias current to the anode 31b of the LD therethrough, includes a center portion 31g overlapping with the anode 31b and side portions 31h in respective sides of the center portion 31g. The center portion 31g protrudes from the side portions 31h toward the anode 31c of the modulator. One of side portions 31h is disposed side by side with respect to the pad 31e of the modulator.

The wiring substrate 32, which is disposed side by side with respect to the EML 31, provides a top surface 32a including a co-planar line 32b that carries a modulating signal to the anode 31c of the EML 31. The co-planar line 32b is formed by a signal line 32c and a ground metal 32d in respective sides of the signal line 32c securing respective gaps therebetween. The signal line 32c, which extends longitudinally in the housing 2, provides an end aligned with the pad 31e. That is, the end of the signal line 32c exists in an extension of the pad 31e. Another longitudinal end of the signal line 32c is connected with one of terminals 23 provided on the feedthrough 2B via a boding wire 72. The signal line 32c, as shown in FIG. 5, is partly overlapped with the bridge substrate 33 including the end thereof. That is, the signal line 32c in an end portion including the end and overlapped with the bridge substrate 33 has a width that is narrower than a width of the signal line 32c in a portion not overlapped with the bridge substrate 33.

The bridge substrate 33, which extends laterally in the housing 2, connects the wiring substrate 32 with the EML 31. Specifically, the bridge substrate 33 connects the signal line 32c with the pad 31e of the modulator. The bridge substrate 33 provides a top surface 33a, side surfaces, 33b to 33e, that demarcate a rectangular slab shape of the bridge substrate 33. The top surface 33a faces the top surfaces, 31a and 32a, of the EML 31 and the wiring substrate 32.

Figure 6:
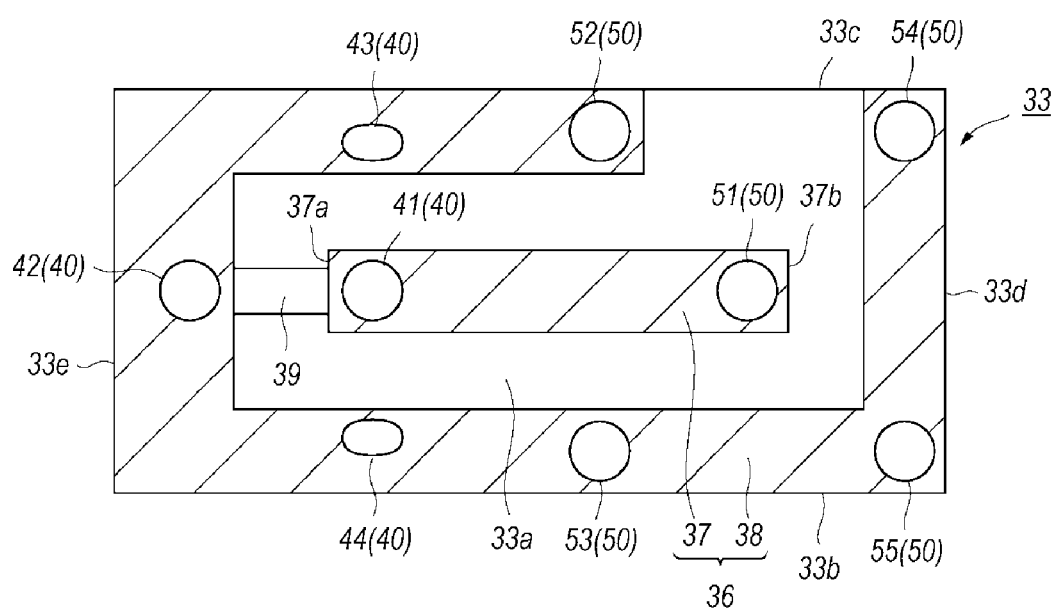
FIG. 6 is a plan view of the top surface of the bridge substrate.

FIG. 6 is a plan view of the top surface 33a of the bridge substrate 33. As shown in FIG. 5 and FIG. 6, the top surface 33a includes a co-planar line 36 that is denoted by hatched areas in FIG. 6. The co-planar line 36, which carries the modulating signal to the modulator in the EML 31, includes a signal line 37 and a ground metal 38 each extending laterally. The signal line 37 in one end 37a thereof faces to and is connected with the pad 31e of the modulator; while, another end 37b thereof faces to and is connected with the end of the signal line 32c on the wiring substrate 32. The signal line 37 is surrounded by the ground meal 38 securing a gap therebetween.

Referring to FIG. 4 to FIG. 6, the ground metal 32d in the wiring substrate 32 is partly removed at a portion where the signal line 37 on the bridge substrate 33 passes. Also, the ground metal 38 in the bridge substrate 33 is partly removed at a portion where the signal line 32c on the wiring substrate 32 passes. These arrangements of the signal lines, 32c and 37, and the ground metals, 32d and 38, may secure impedance characteristics of the co-planar lines, 32b and 36. The ground metal 32d in the wiring substrate 32 surrounds the signal line 32c except for the portion where the signal line 37 in the bridge substrate 33 passes. Thus, the ground metal 32d is divided there.

This arrangement of the ground metal 32d may suppress capacitive coupling between the ground metal 32d and the signal line 37, which may set characteristic impedance of the co-planar line 36 in the bridge substrate 33, for instance, to be 50 Ω.

Also, the ground metal 38 in the bridge substrate 33 surrounds the signal line 37 except for the portion where the signal line 32c in the wiring substrate 32 passes. The ground metal 38 is divided there, which may suppress the capacitive coupling between the signal line 37 and the ground metal 32d, and set the characteristic impedance of the co-planar line 32b in the wiring substrate 32.

Also, the signal line 32c in the wiring substrate 32 has a narrowed width in the portion where the bridge substrate 33 covers. The wiring substrate 32 and the bridge substrate 33 are generally made of material having relatively greater dielectric constant. Accordingly, the co-planar line 32b shifts the characteristic impedance thereof in the portion where the bridge substrate 33 covers the wiring substrate 32 from the designed value. The signal line 32c in the narrowed width may compensate this shift of the characteristic impedance of the co-planar line 32b there and may set the impedance to be, for instance, 50 Ω.

The ground metal 38 in the bridge substrate 33 extends to edges of the side surfaces, 33b and 33c, in respective sides of the signal line 37, while, in a side along the side surface 33e. Thus, the ground metal 38 is formed in a U-shape accompanying with those along the side surfaces, 33c and 33d, so as to surround an end 37a of the signal line 37. On the other hand, in another side along the side surface 33d, the ground metal 38 has an L-shape accompanying with that along the side surface 33b so as to make a space against the ground metal 38 along the side surface 33c. Referring to FIG. 6, the bridge substrate 33 also provides a terminator 39 between the end 37a of the signal line and the ground metal 38 provided along the side surface 33e. The terminator 39, which has resistance of, for instance, 50 Ω, may terminate the co-planar lines, 32b and 36, in respective substrates, 32 and 33.

The source assembly 11 further provides a coupling structure 40 and another coupling structure 50, where FIG. 6 shows those coupling structures, 40 and 50, on the bridge substrate 33. The former coupling structure 40 is disposed between the EML 31 and the bridge substrate 33 and compensates an inclination of the bridge substrate 33 against the EML 31. That is, the coupling structure 40 may make the top surface 33a of the bridge substrate 33 parallel to the top surface 31a of the EML 31. The coupling structure 40 provides posts, 41 to 44, each having a column shape.

Figure 7:
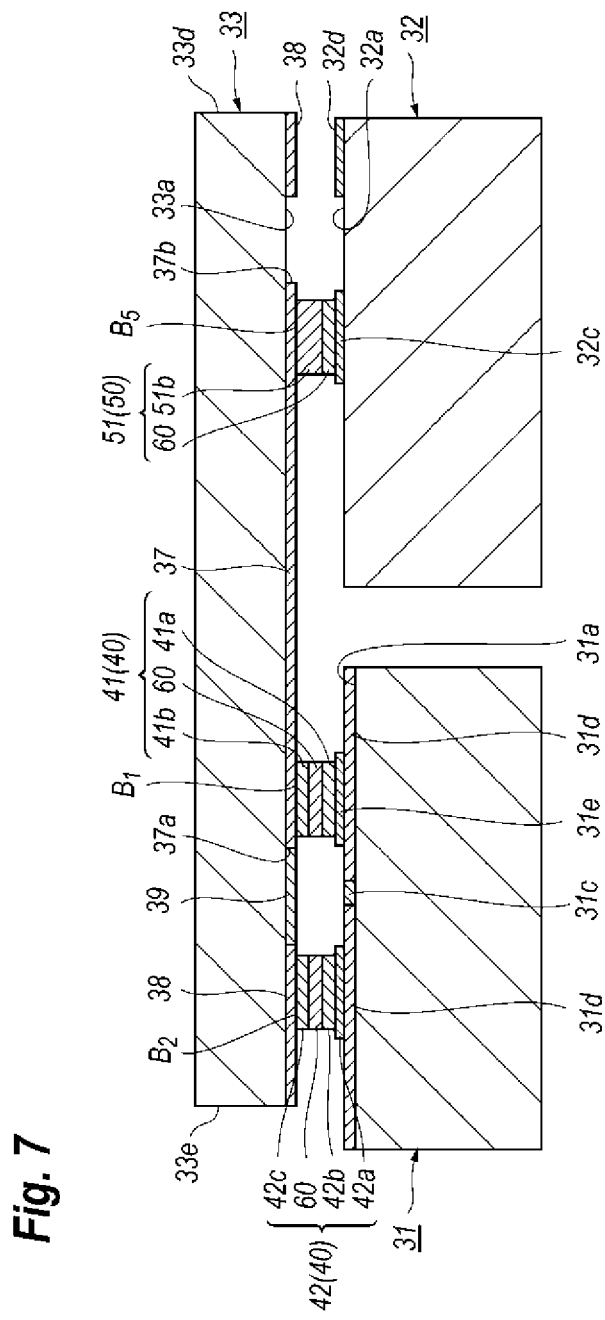
FIG. 7 is a cross sectional view of the source assembly taken along the line VII-VII indicated in FIG. 5.
Figure 8:
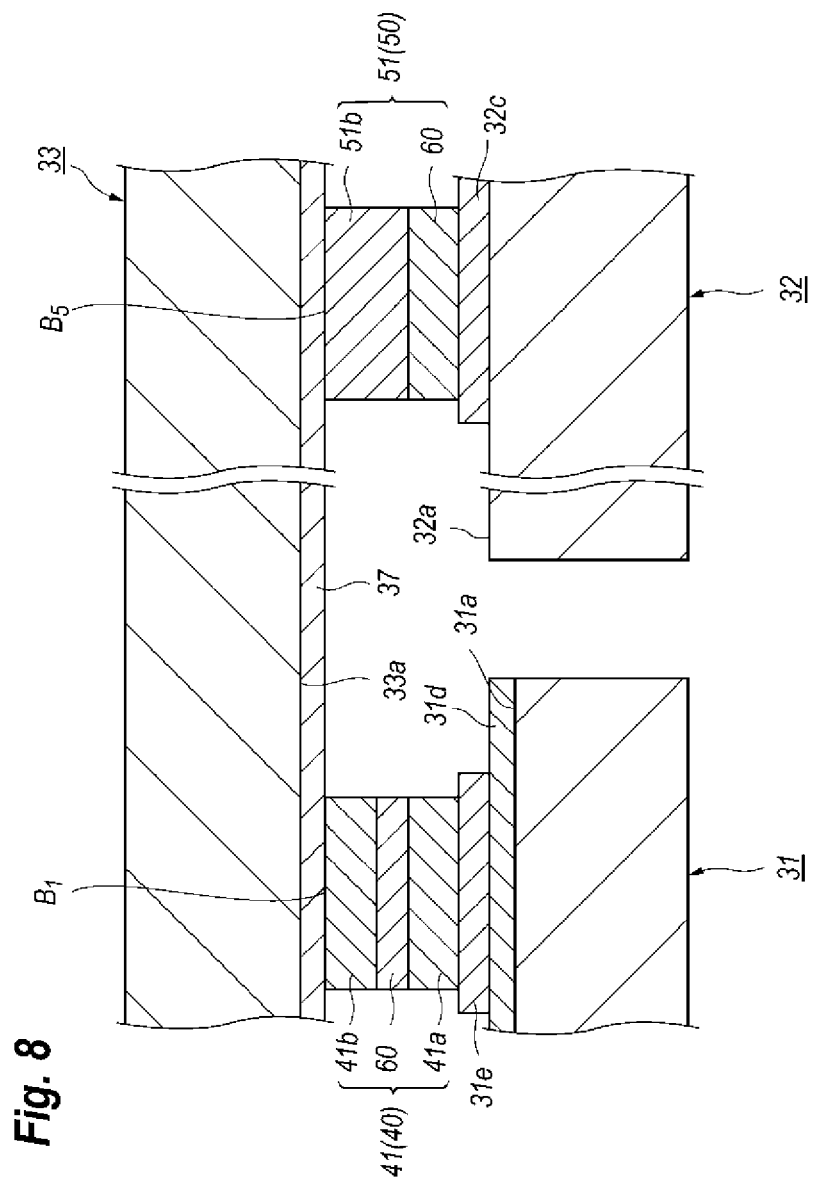
FIG. 8 is magnified cross sectional view of the coupling structures.

FIG. 7 is a cross sectional view of the source assembly 11 taken along the line VII-VII indicated in FIG. 5. The post 41, which is put between the signal pad 31e and the end 37a of the signal line 37, electrically connects the signal line 37a with the pad 31e. The post 41 may have a total thickness of 5 to 40 μm. FIG. 8 is a magnified cross sectional view of the coupling structures, 40 and 50. The post 41 includes metal first and second layers, 41a and 41b, from the side of the pad 31e on the EML 31. The first metal layer 41a may be stacked on the pad 31e by plating, and the second metal layer 41b may be stacked on the signal line 37 also by plating. These two metal layers, 41a and 41b, may be attached to each other by conductive adhesive 60.

The post 42 is disposed side by side with respect to the post 41; specifically, the post 42 is disposed closer to the side surface 33e in the bridge substrate 33 compared with the former post 41. The post 42 in a thickness thereof is adjusted such that a level of an interface B2 between the ground metal 38 in the bridge substrate 33 and the post 42 becomes substantially equal to a level of an interface B1 between the signal line 37 and the signal post 41. The post 42 may have a thickness of also 5 to 40 μm.

The post 42 includes first to third metal layers, 42a to 42c, from the side of the EML 31. Specifically, the post 42 includes the first metal layer 42a on the insulating film 31d, the second metal layer 42b on the first metal layer 42a, and the third metal layer 42c on the ground metal 38 in the bridge substrate 33. Those metal layers, 42a to 42c, may be formed by plating. The post 42 further provides a conductive adhesive 60 between the second and third metal layers, 42b and 42c. The posts, 43 and 44, are disposed so as to put the post 41 therebetween, exactly, in symmetrical positions with respect to the signal post 41. The post 43 is disposed closer to the side surface 33c, while, the other post 44 is disposed closer to the side surface 33b, and disposed between the post 41 and the pad 31f on the EML 31. Because the posts, 42 to 44 are connected with the ground metal 38, those posts, 42 to 44, may be called as ground posts.

Figure 9:
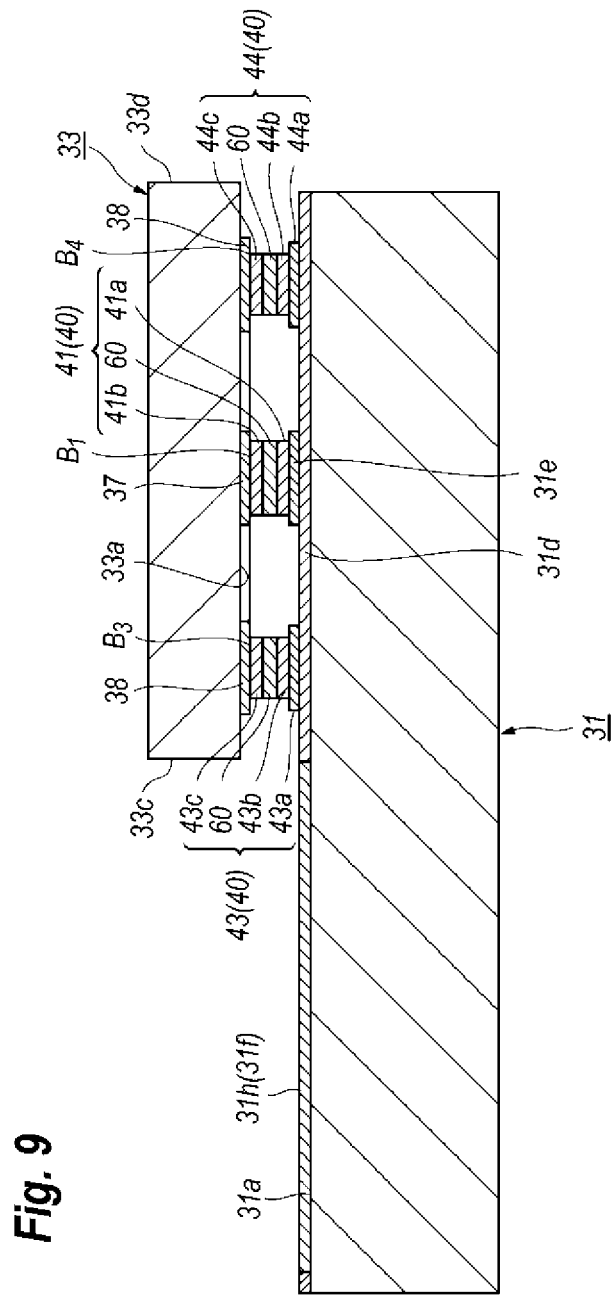
FIG. 9 is a cross sectional view of the source assembly taken along the line IX-IX indicated in FIG. 5.

The post 43 has an extended circular cross section, specifically, a lateral length along the side surface 33c is greater than a longitudinal length along the side surface 33e of the bridge substrate 33 in order to set an enough gap against the pad 31f, exactly the side portion 31h of the pad 31f. The post 44 also has an extended circular cross section; specifically, the post 44 has a lateral length along the side surface 33b substantially equal to the lateral length of the post 43 and greater than a longitudinal length along the side surface 33e. FIG. 9 is a cross sectional view of the source assembly 11 taken along the line IX-IX indicated in FIG. 5. The posts, 43 and 44, have thicknesses substantially equal to the thickness of the signal post 41; specifically, a level of an interface B3 between the ground metal 38 and the post 43, and a level of an interface B4 between the ground metal 38 and the post 44 are substantially equal to the level of the interface B1 between the signal line 37 and the post 41, and to the level of the interface B2 between the ground metal 38 and the post 42 each measured from the top surface 31a of the EML 31. The posts, 43 and 44, have an arrangement same with that of the post 42; that is, as shown in FIG. 9, the posts, 43 and 44, each include three metal layers, 43a to 43c and 44a to 44c, from the side of the EML 31, where those metal layers, 43a to 43c and 44a to 44c, may be formed by plating. The posts, 43 and 44, may further provide conductive adhesives 60 to connect the metal layers, 43b and 44b, with the metal layers, 43c and 44c. Because the post 41 connects the signal line 37 with the signal pad 31e, the post 41 may be called as a signal post; while, other posts, 42 to 44, are connected with the ground metal 38 on the bridge substrate 33; accordingly, the posts, 42 to 44, are called as ground posts.

Referring to FIG. 5 again, the coupling structure 50, which is put between the wiring substrate 32 and the bridge substrate 33, may set a gap therebetween as compensating an inclination of the bridge substrate 33 against the wiring substrate 32. That is, the coupling structure 50 may set the bridge substrate 33 substantially parallel to the wiring substrate 32. The coupling structure 50 includes posts, 51 to 55, each having a pillar shape.

The post 51, which is put between the signal lines, 32c and 37, has a thickness so as to compensate a level of the interface B5 between the signal line 37, exactly, at the other end 37b of the signal line 37, and the post 51 so as to be equal to the levels of the interfaces, B1 to B4, where those levels of the interfaces, B1 to B5, are measured from the top surface 31a of the EML 31. The post 51 may have a thickness of also 5 to 40 μm. Referring to FIG. 7, the post 51 may include a metal layer 51b on the signal line 37, where the metal layer 51b may be formed by plating, and a conductive adhesive 60 put between the metal layer 51b and the signal line 32c on the wiring substrate 32.

Referring to FIG. 5 again, the posts, 52 to 55, are put between the ground metal 32d in the wiring substrate 32 and the ground metal 38 in the bridge substrate 33. The posts, 52 and 54, are disposed closer to the side surface 33c, while, the posts, 53 and 55, are disposed closer to the side surface 33b. Also, the posts, 54 and 55, are disposed closer to the side surface 33d with respect to the posts, 52 and 53. Those posts, 52 to 55, have arrangement substantially equal to the arrangement of the post 51 and may be formed concurrently with the post 51.

Figure 25A:
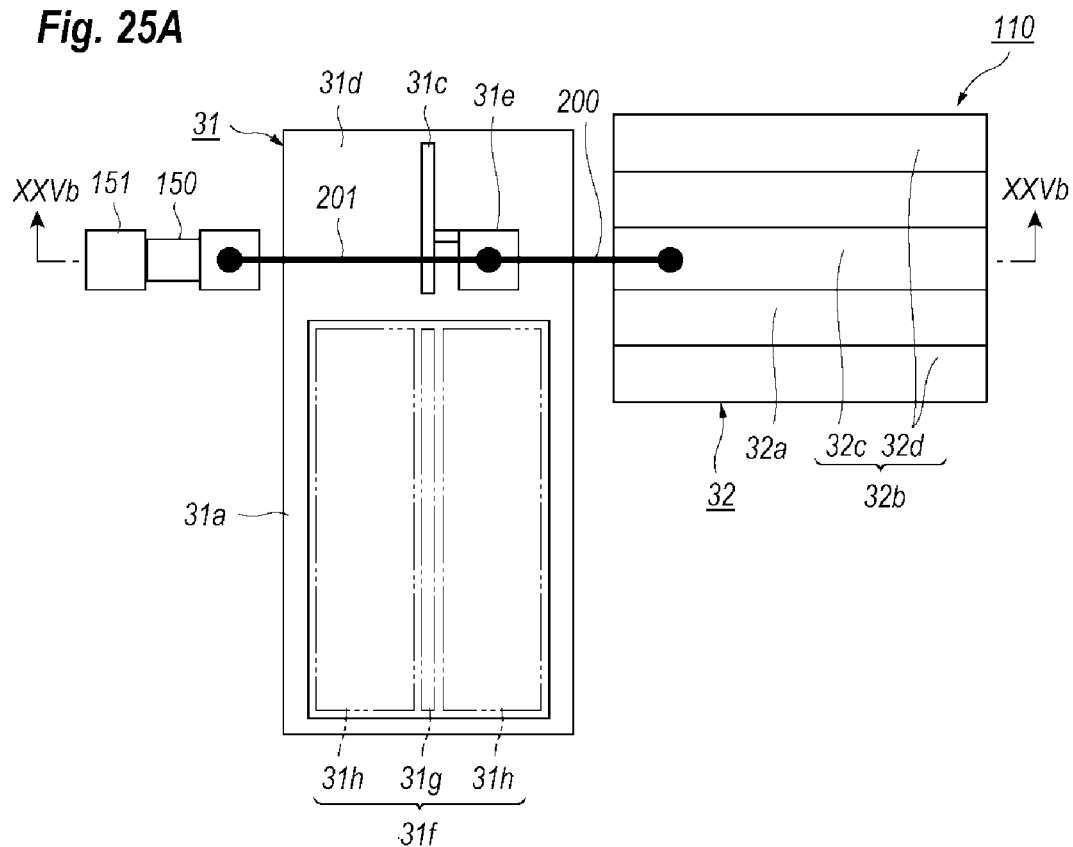
Figure 25B:
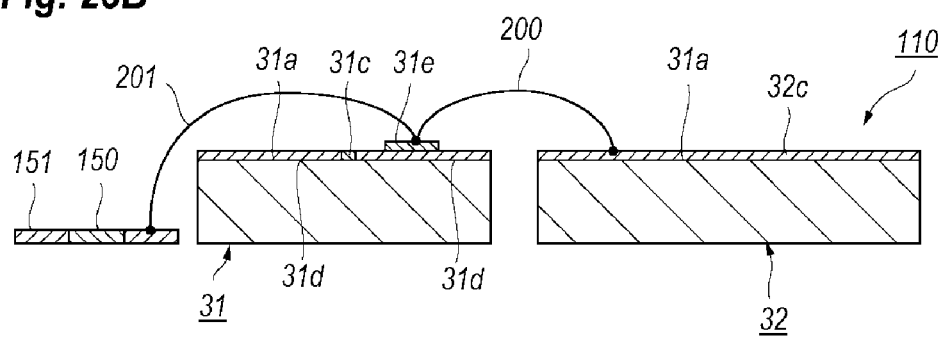
FIG. 25B is a cross sectional view thereof taken along the line XXVb-XXVb indicated in FIG. 25A.

Next, advantages of the arrangement thus described for the optical module 1 will be described comparing with a conventional arrangement. FIG. 25A is a plan view schematically showing a conventional source assembly 110, while, FIG. 25B is a cross sectional view thereof taken along the line XXVb-XXVb indicated in FIG. 25A. The conventional source assembly 110 includes an EML 31, a wiring substrate 32, and bonding wires, 200 and 201, instead of the bridge substrate 33 of the present invention. The pad 31f for the LD in the EML 31 also has a rectangular plane shape but the center portion 31g thereof does not protrude from the edge of the side portion 31h. The pad 31e for the modulator in the EML 31 is wire-bonded with the co-planar line 32b via the bonding wire 200 and with a terminator 150 with the bonding wire 201. That is, the terminator 150 is provided outside of the EML 31. The terminator 150 accompanies a ground metal 151. That is, the terminator provides a pad wire-bonded with the pad 31e in one end thereof and another end grounded to the ground metal 151. A configuration to connect between elements with a bonding wire causes impedance mismatching due to inductive components inherently attributed to a bonding wire. The impedance mismatching may degrade quality of a modulating signal carried on the co-planar line.

The source assembly of the present embodiment provides the bridge substrate 33 for electrically connecting the wiring substrate 32 with the EML 31. A modulating signal carried on the co-planar line 32b on the wiring substrate 32 is provided to the EML 31, exactly, the pad 31e in the modulator through the co-planar line 36 on the bridge substrate 33 without being transferred on any bonding wires. Moreover, the connection between the wiring substrate 32 and the bridge substrate 33 and between the bridge substrate 33 and the EML 31 may be realized by the coupling structures, 40 and 50. Accordingly, the impedance mismatching may be effectively suppressed, which may suppress degradation of the modulation signal to the EML 31.

Also, the source assembly 10 of the embodiment provides the terminator 39 at the end 37a of the signal line 37 on the bridge substrate 33. Because the end 37a is directly connected with the pad 31e on the EML 31 through the signal post 41, the co-planar line 36 may be regularly terminated without interposing any parasitic component between the pad 31e and the terminator 39.

Figure 27:
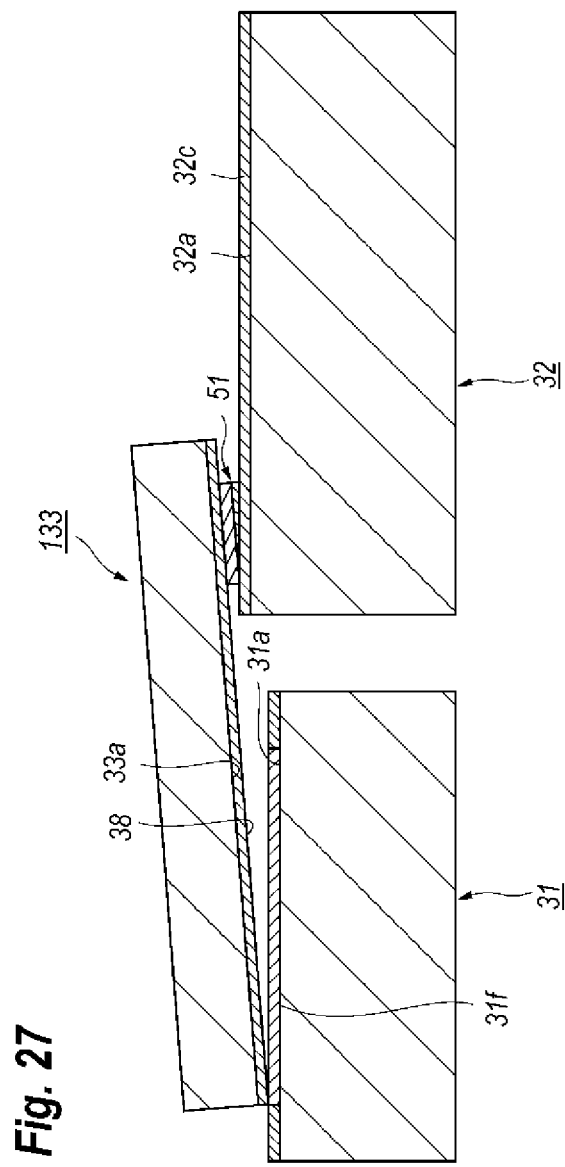
FIG. 27 is a cross sectional view of the conventional source assembly taken along the line XXVII-XXVII indicated in FIG. 26.

Also, the embodiment provides the post 42 on an extension of the signal line 37, where the post 42 is disposed side by side with respect to the pad 31e. That is, the pad 31e is disposed between the end 37b of the signal line 37 and the post 42. FIG. 26 is a plan view showing another conventional source assembly 110A, and FIG. 27 is a cross sectional view of the conventional source assembly 110A taken along the line XXVII-XXVII indicated in FIG. 26. The conventional source assembly 110A provides the bridge substrate 133 between the EML 31 and the wiring substrate 32; but omits ground posts, 42 to 44, in the coupling structure 40. The conventional source assembly 110A provides only the signal post 41 in the coupling structure 40.

In the conventional source assembly 110A providing the bridge substrate 133, the bridge substrate 133 is possibly inclined with respect to the top surface 31a of the EML 31 along a direction connecting the EML 31 with the wiring substrate 32 because of differences in physical dimensions, especially, thicknesses of the EML 31 and the wiring substrate 32. Under such a condition, the anode 31c and/or the pad 31f for the LD on the EML 31 is sometimes in contact with the ground metal 38 on the bridge substrate 33, as shown in FIG. 27.

Accordingly, the present embodiment of the source assembly 10 provides the post 42 formed on the insulating film 31d at the extension of the signal line 37 and adjusts the thickness thereof to make the top surface 33a of the bridge substrate 33 substantially parallel to the top surface 31a of the EML 31, which may prevent the anode 31c and/or the pad 31f on the top surface 31a of the EML 31 from being in contact with the ground metal 38.

Figure 28:
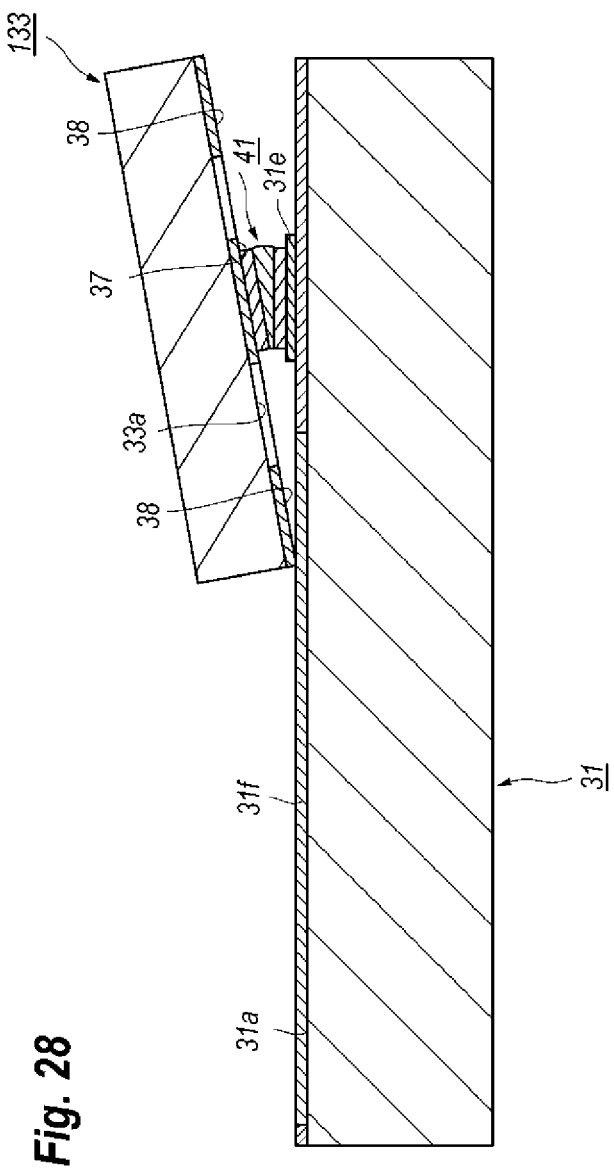
FIG. 28 is a cross sectional view of the conventional source assembly taken along the line XXVIII-XVIII indicated in FIG. 26.

Also, the coupling structure 40 of the present source assembly 10 may further provide other two ground posts, 43 and 44, in respective longitudinal sides of the signal post 41. FIG. 28 is a cross sectional view of the conventional source assembly 110A taken along the line XXVIII-XXVIII indicated in FIG. 26. Because the bridge substrate 133 does not provide the ground posts, the bridge substrate 133 is no longer maintained in an attitude parallel to the top surface 31a of the EML 31, the anode 31c and/or the pad 31f on the EML 31 is possibly in contact with the ground metal 38 on the bridge substrate 133.

The present embodiment, accordingly, provides two ground posts, 42 and 43, in respective longitudinal sides of the signal post 41. Adjusting the thicknesses of the ground posts, 42 and 43, the bridge substrate 33 in the top surface 33a thereof may be parallel to the top surface 31a of the EML 31, which prevents the top surface 33a of the bridge substrate 33 from being in contact with the top surface 31a of the EML 31.

Also the center portion 31g of the pad 31f protrudes toward the pad 31e from the edge of the side portions 31h, and the ground post 43 may be disposed side by side with respect to this protruding portion of the center portion 31g, and between the side portion 31h and the pad 31e. This arrangement of the center portion 31g, the side portion 31h, and the ground post 42 may prevent the short circuit between the pad 31f and the ground metal 38 on the bridge substrate 33 securing a cavity length of the LD, which is substantially equal to the length of the center portion 31g.

The coupling structure 50 in the present embodiment may provide the signal post 51 and the ground posts, 52 to 55, that surround the signal post 51, where the signal post 51 electrically connects the signal line 32c with the signal line 37, while, the ground posts, 52 to 55, connect the ground metal 32d with the ground metal 38. Adjusting thicknesses of those posts, 51 to 55, may prevent the signal line 37 in the end 37b thereof from being in contact with the ground metal 32d. Because the co-planar line 32b on the wiring substrate 32 may be regularly connected with the co-planar line 36 on the bridge substrate 33, the modulating signal carried on the co-planar lines, 32b and 36, may be regularly provided to the modulator in the EML 31 without being deformed by impedance mismatching.

[First Modification]

Figure 10:
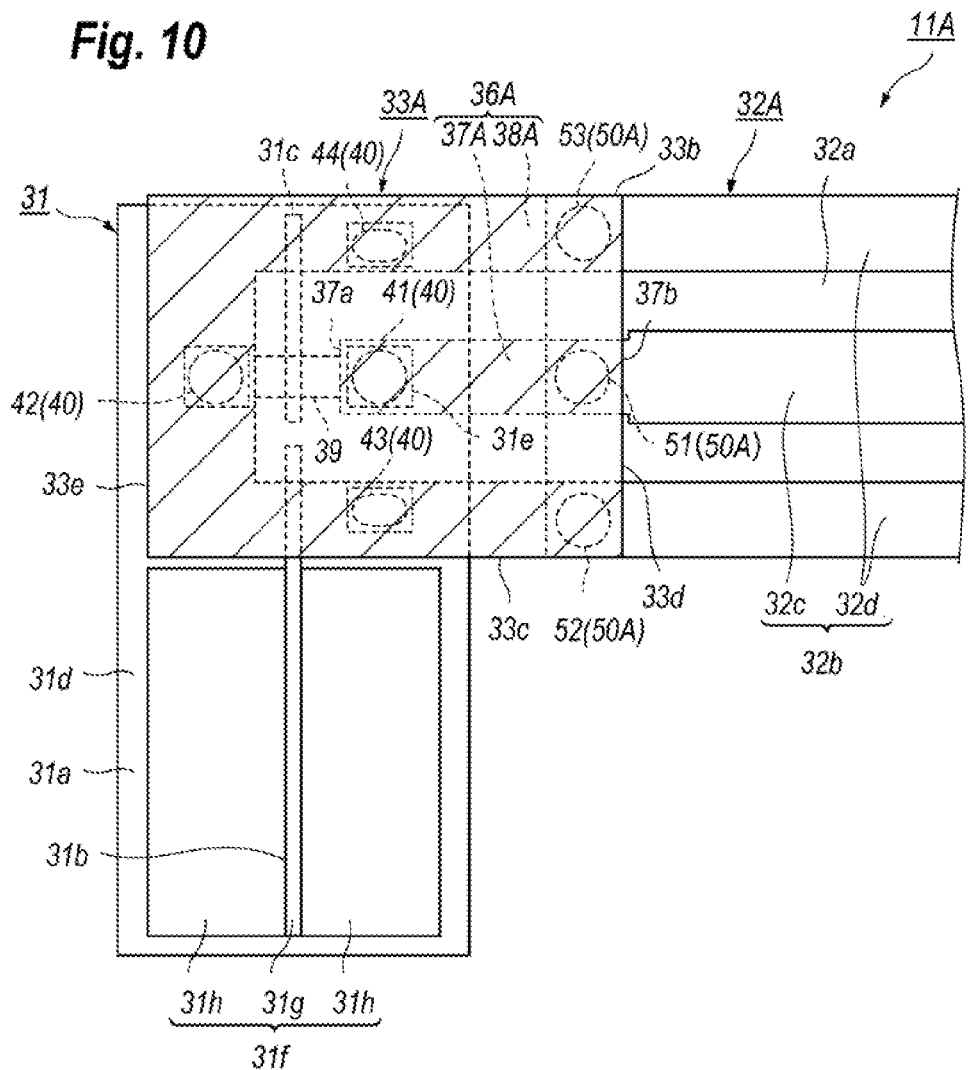
FIG. 10 is a plan view showing a source assembly that is modified from the source assembly shown in FIG. 5.

FIG. 10 is a plan view showing a source assembly 11A that is modified from the source assembly 11 shown in FIG. 5. The source assembly 11A shown in FIG. 10 has a feature that the co-planar line 32b on the wiring substrate 32A laterally extends, namely, along a direction perpendicular to the anode of the LD and that of the modulator in the EML 31. Also, the bridge substrate 33A has an arrangement different from that shown in FIG. 5. The end 37b of the signal line 37A reaches the side surface 33d, while the ground metal 38A provides no portion of the L-character and reaches the side surfaces, 33b and 33c. The end of the ground metal 38A also reaches the side surface 33d.

The coupling structure 50A of the present modification provides no ground posts, 54 and 55, but provides the ground posts, 52 and 53, in respective sides of the signal post

51. Specifically, the ground post 52 is provided closer to the side surface 33c, while, the other ground post 53 is disposed closer to the side surface 33b. The coupling structure 50A of the present modification shows a function substantially same with the coupling structure 50 in the aforementioned embodiment.

[Second Modification]

Figure 11:
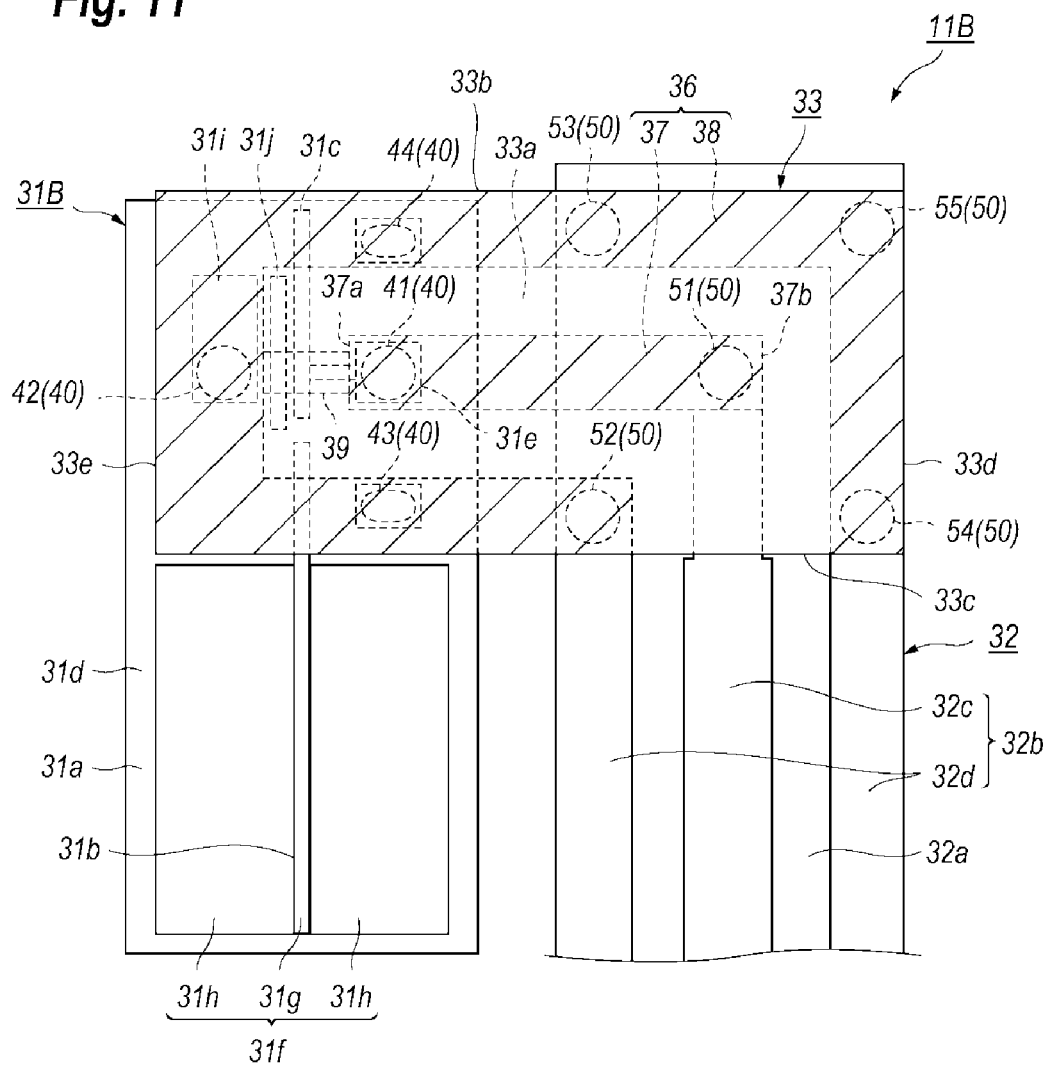
FIG. 11 is a plan view showing another modification of the source assembly.

FIG. 11 is a plan view showing another modification of the source assembly 11. The modified source assembly 11B shown in FIG. 11 has a feature of an arrangement of the EML 31B. That is, the EML 31B of the present modification provides a cathode 31i and a trench 31j that are exposed on the top surface 31a of the EML 31B. The cathode 31i, which is grounded, is disposed side by side with respect the anode 31c of the modulator; specifically, the cathode 31i extends substantially in parallel to the anode 31c and is disposed in opposite side of the signal pad 31e with respect to the anode 31c.

The ground post 42 in the coupling structure 40 connects the cathode 31i with the ground metal 38 on the bridge substrate 33. The trench 31j, which extends along the anode 31c, or substantially parallel to the anode 31c, is disposed between the cathode 31i and the anode 31c to isolate therebetween. The trench 31j reaches from the top surface 31a of the EML 31B to a semiconductor layer common to the LD. That is, the trench 31j removes semiconductor layers closer to the top surface 31a in the modulator and leaves semiconductor layers deeply formed and commonly attributed to the LD. Also, the trench 31j in a bottom and a side closer to the ground post 42 provide a metal film continuous to the cathode 31i. Thus, the semiconductor layer common to the LD is grounded through the metal film in the bottom and the side of the trench 31j, the cathode 31i, and the ground post 42. The modulator 31B in the cathode 31i thereof is directly grounded to the ground metal 38 on the bridge substrate 33; accordingly, degradation in the quality of the modulation signal carried on the signal line 37 and the signal post 41 may be suppressed.

[Third Modification]

Figure 12:
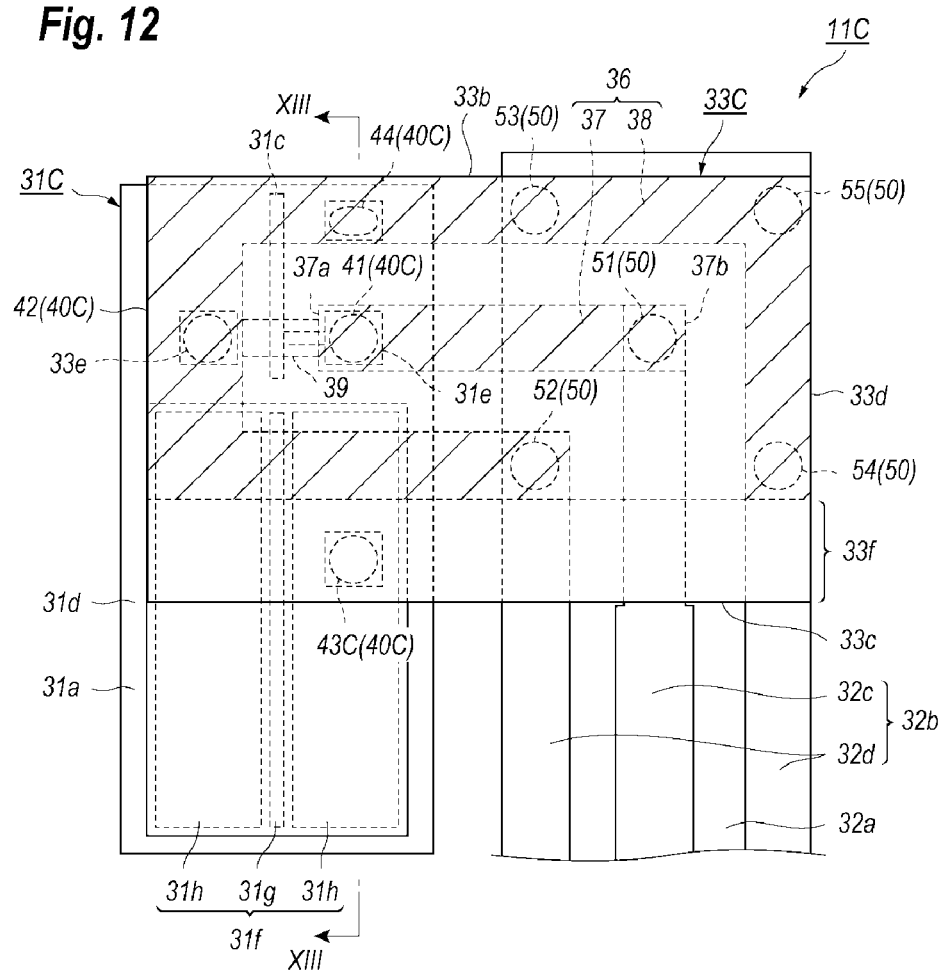
FIG. 12 is a plan view showing still another modification of the source assembly.
Figure 13:
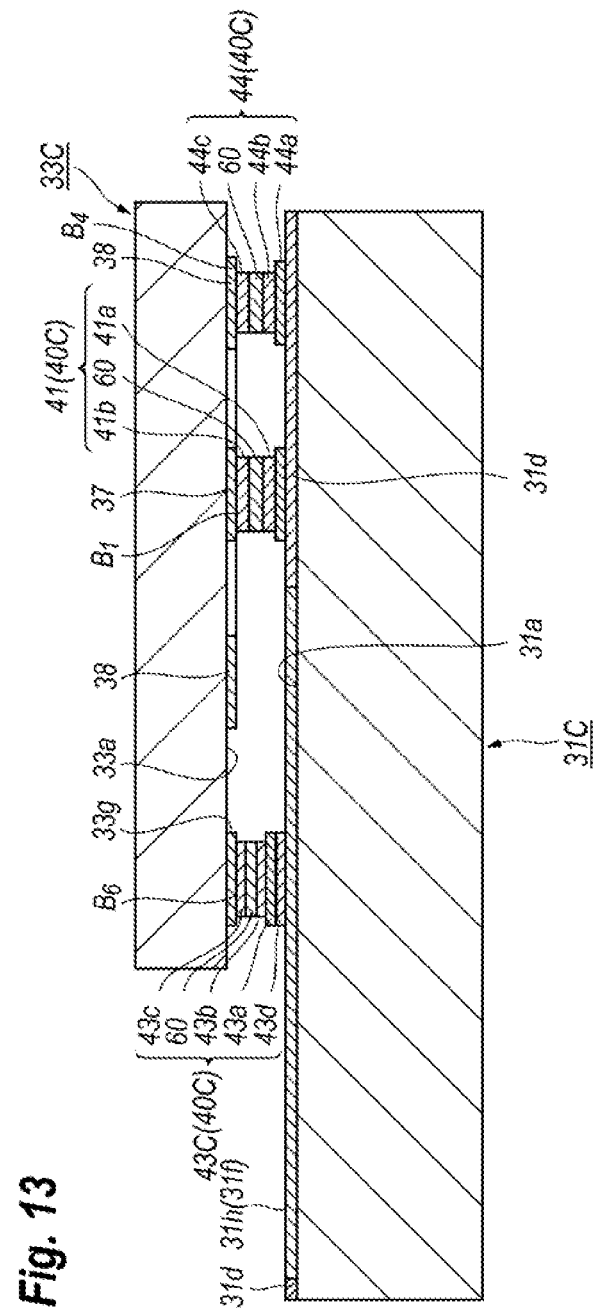
FIG. 13 is a cross sectional view of the modified source assembly shown in FIG. 12 taken along the line XIII-XIII indicated in FIG. 12.

FIG. 12 is a plan view showing still another modification of the source assembly 11C, and FIG. 13 is a cross sectional view of the modified source assembly 11C taken along the line XIII-XIII indicated in FIG. 12. The source assembly 11C provides the bridge substrate 33C with an arrangement different from aforementioned source assemblies, 11 to 11B. That is, the modified source assembly 11C provides a modified bridge substrate 33C and a modified coupling structure 40C. The center portion 31g of the pad 31f in the LD does not protrude from the side portions 31h, that is, respective ends of the center portion 31g and the side portions 31h are aligned to each other. Also, the bridge substrate 33C further provides a space 33f. That is, the ground metal 38 extends along the side surface 33c making the space 33f against the side surface 33c.

The coupling structure 40C of the third modification 11C provides an additional post 43C on the pad 31f of the LD, exactly, on the one of the side portions 31h closer to the wiring substrate 32. The post 43C, as shown in FIG. 13, includes metal layers, 43a to 43c, the conductive adhesive 60, and an insulating film 43d between the pad 31h and the first metal film 43a. Also, the bridge substrate 33C further provides a metal film 33g between the space 33f and the post 43C. Accordingly, the post 43C is electrically floated from the ground. The post 43C has a thickness such that the level of an interface B6 between the metal film 33g and the post 43C becomes substantially equal to the level of the interfaces, B1, B2, B4, refer to FIG. 7, and the interface B3 refer to FIG. 9.

[Fourth Modification]

Figure 14:
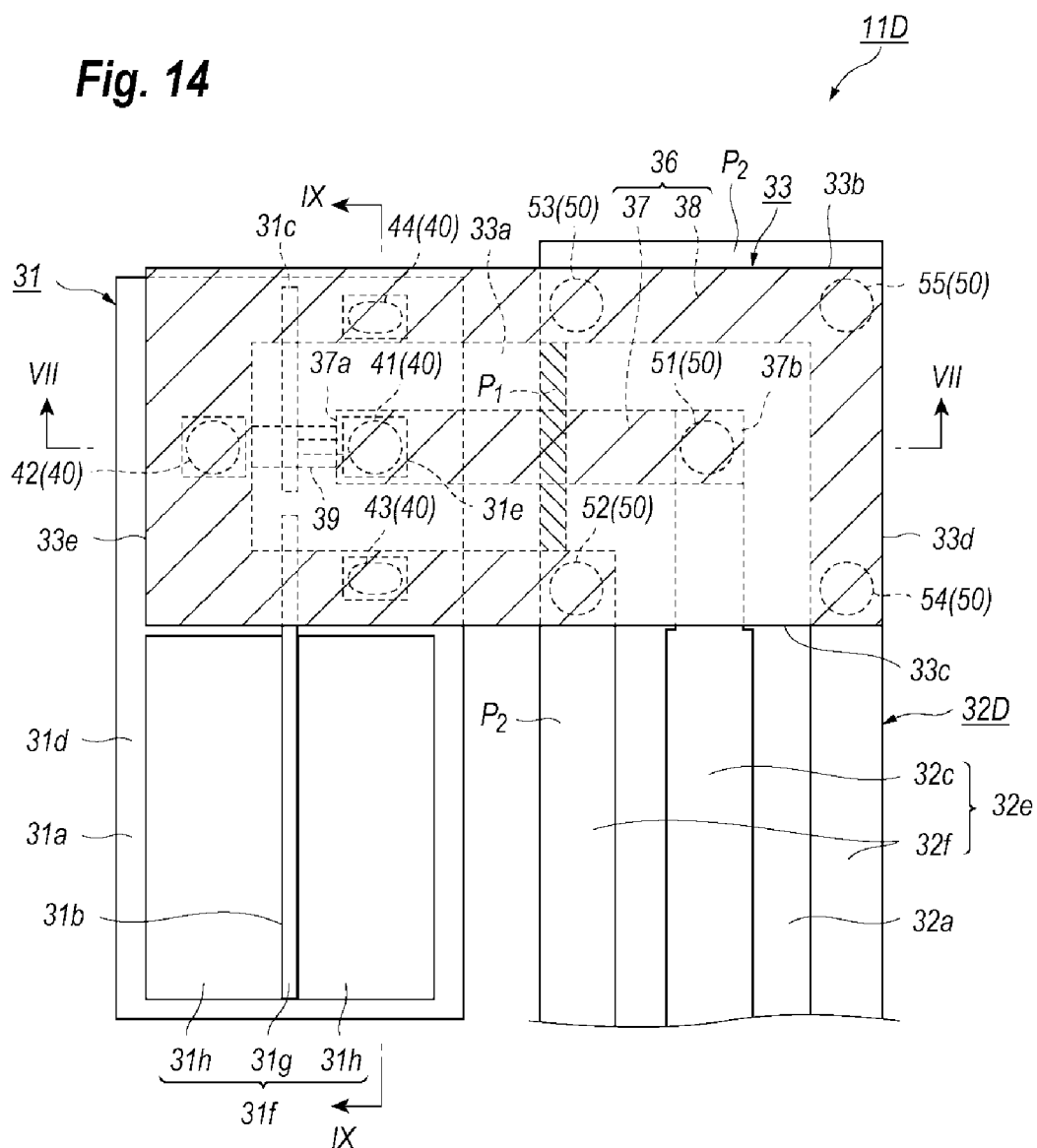
FIG. 14 is a plan view showing a fourth modification of the source assembly.

FIG. 14 is a plan view showing a fourth modification of the source assembly 11D. The source assembly 11D has a feature distinguishable from aforementioned source assemblies, 11 to 11C, that the wiring substrate 32D provides a modified ground metal. That is, the co-planar line 32e of the present modification provides a modified ground metal 32f that includes an additional portion $P_1$ that connects other portions $P_2$ of the ground metal 32f and extends in an edge facing the EML 31. The portion $P_1$ has a width narrower than that of the other portions $P_2$. Because the portion P1 connects the ground metal 32f but has a narrowed width, the ground metal 32f may stabilize the ground without affecting the characteristic impedance of the co-planar line 32e.

[Fifth Modification]

Figure 15:
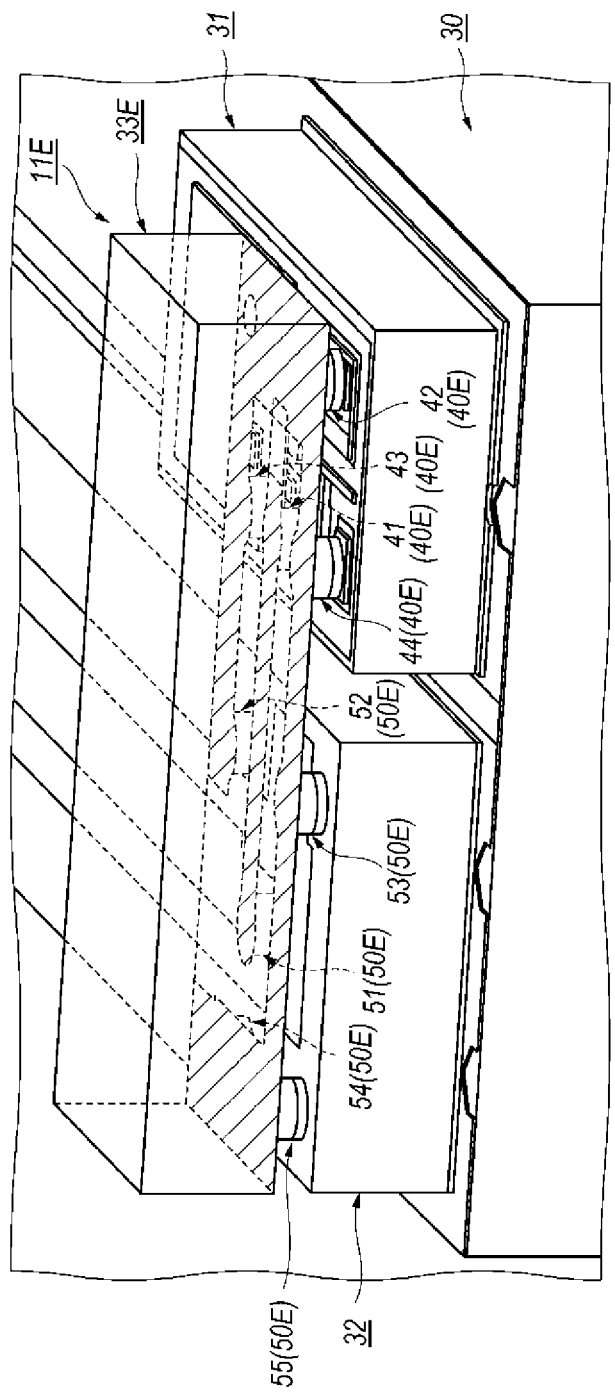
FIG. 15 is a perspective view showing a source assembly according to the fifth modification.
Figure 16:
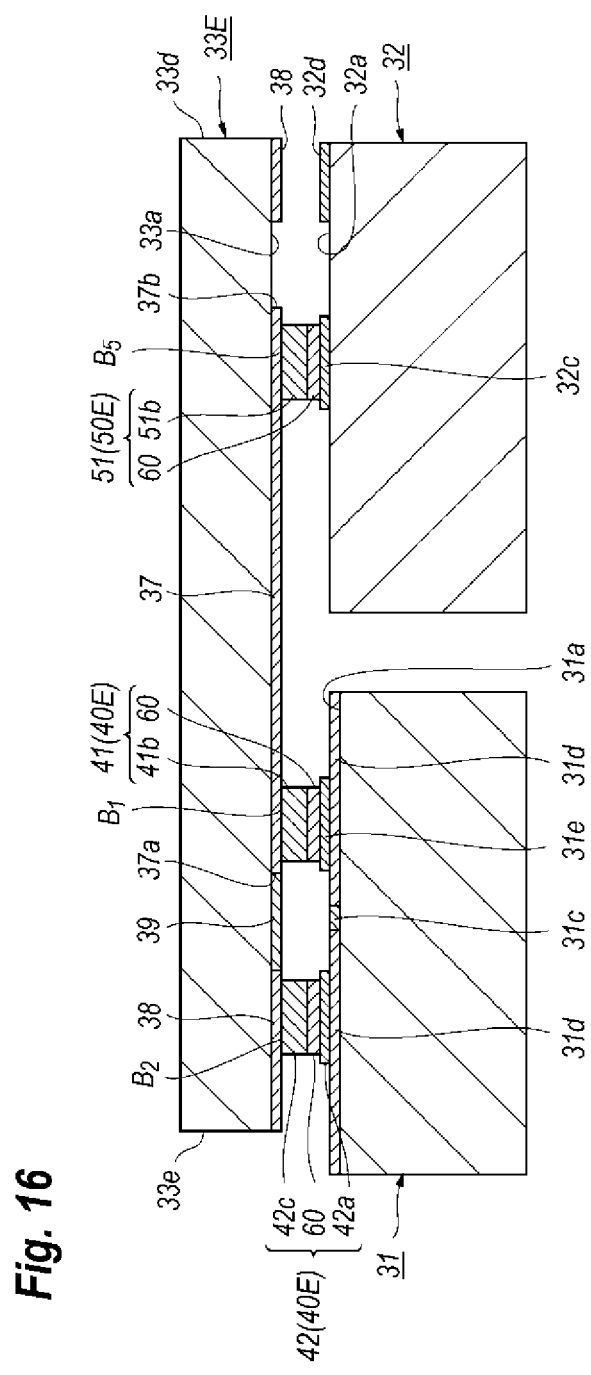
FIG. 16 is a cross sectional view of the source assembly shown in FIG. 15 taken along the line corresponding to VII-VII in FIG. 5.

FIG. 15 is a perspective view showing a source assembly according to the fifth modification, FIG. 16 is a cross sectional view of the source assembly 11E taken along the line corresponding to VII-VII indicated in FIG. 5. The source assembly 11E of the present modification has a feature that the coupling structure 40E and/or the coupling structure 50E are compressed. That is, the signal post 41 and the ground posts, 42 to 44, the signal post 51, and the ground posts, 52 to 55, are compressed between the top surfaces, 31a to 33a, and 32a and 33a, respectively. The posts, 41 to 44, and the posts, 51 to 55, provide thickened metal films in contact with the signal line 37 and the ground line 38. As shown in FIG. 16, because the signal post 41 includes no first metal layer 41a, the second metal layer 41b in contact with the signal line 37 is tightly and securely in contact with the pad 31e with the conductive adhesive 60 put therebetween. The second metal layer 41b is thicker than that of the conductive adhesive 60. When the signal post 41 is compressed, the thickened second metal layer 41b is compressed between the signal line 37 and the conductive adhesive 60. The second metal layer 41b preferably has a thickness of 5 to 25 μm, and the conductive adhesive 60 preferably has a thickness of, for instance, 1 to 10 μm. In the present embodiment, the second metal layer 41b has a thickness of around 15 μm, while, the conductive adhesive 60 has a thickness of 8 μm.

The second metal layer 41b may include primarily gold (Au) or copper (Cu). In the present embodiment, the second metal layer 41b may have stack metals of platinum (Pt), and first and second gold (Au) from the side of the signal line 37 in the bridge substrate 33E. The Pt layer has a thickness preferably thinner than that of the first Au layer but thicker than that of the second Au layer. Specifically, the Pt layer preferably has a thickness of 0.1 to 1.0 μm, the first Au layer preferably has a thickness of 1 to 5 μm, and the second Au layer preferably has a thickness of 0.1 to 0.5 μm. Thicknesses of the metal layers of the present embodiment are, 0.5 μm, 5.0 μm, and 0.1 μm, for the Pt layer, the first Au layer, and the second Au layer, respectively. The signal pad 31e of the present embodiment has stacked metals of TiW layer, a third Au layer, and a fourth Au layer, where the TiW layer has thickness substantially equal to a thickness of the third Au layer but thinner than a thickness of the fourth Au layer. For instance, the TiW layer and the third Au layer preferably have a thickness of 0.05 to 0.5 μm, while, the fourth Au layer preferably has a thickness of 1.0 to 5.0 μm, where the present embodiment provides the TiW layer and the third Au layer with a thickness of 0.1 μm, while, the fourth Au layer with a thickness of 3.0 μm. The third Au layer may be formed on the TiW layer by metal sputtering, while, the fourth Au layer may be formed by plating using the stacked metals of the TiW layer and the third Au layer as a seed metal. The conductive adhesive 60 may be a type of eutectic solder, such as gold tin (AuSn), and have a pillared shape.

The ground posts 42 to 44, may have an arrangement same with that of the signal post 41. That is, as shown in FIG. 16, the ground posts, 42 to 44, omit the metal layers, 42b to 44b; and the metal layers, 42c to 44c, in the side of the bridge substrate 33E are fixed to the metal layers, 42a to 44a, in the side of the EML 31 with the conductive adhesive 60. The metal layers, 42c to 44c, are thickened similar to the metal layer 41b. When the ground posts, 42 to 44, are compressed, the thickened metal layers, 42b to 44b, are primarily compressed.

Also, as shown in FIG. 16, the signal post 51 in the metal layer 51b thereof has an arrangement substantially same with the arrangement of the metal layer 41b in the signal post 41. When the signal post 51 is compressed, the thickened metal layer 51b is primarily compressed. The ground posts, 52 to 55, may have the arrangement substantially same with the arrangement of the signal post 51. In the present modification, the wiring substrate 32 and the bridge substrate 33E may be made of aluminum nitride (AlN), and the bridge substrate 33E has a thickness of 110 µm. The EML 31 may be primarily made of n-type indium phosphide (n-InP) with a thickness around 100 µm. The signal lines, 37 and 32c, and the ground lines, 38 and 32d, may be made of stacked metals of titanium (Ti), platinum (Pt), and gold (Au), where the Pt layer may be thicker than the Ti layer, while, Au layer is thicker than Pt layer. In an example, Ti layer, Pt layer, and Au layer preferably have thicknesses of 0.1, 0.2, and 0.5 µm. The insulating film 31d preferably has a thickness of 1.4 µm.

Figure 17:
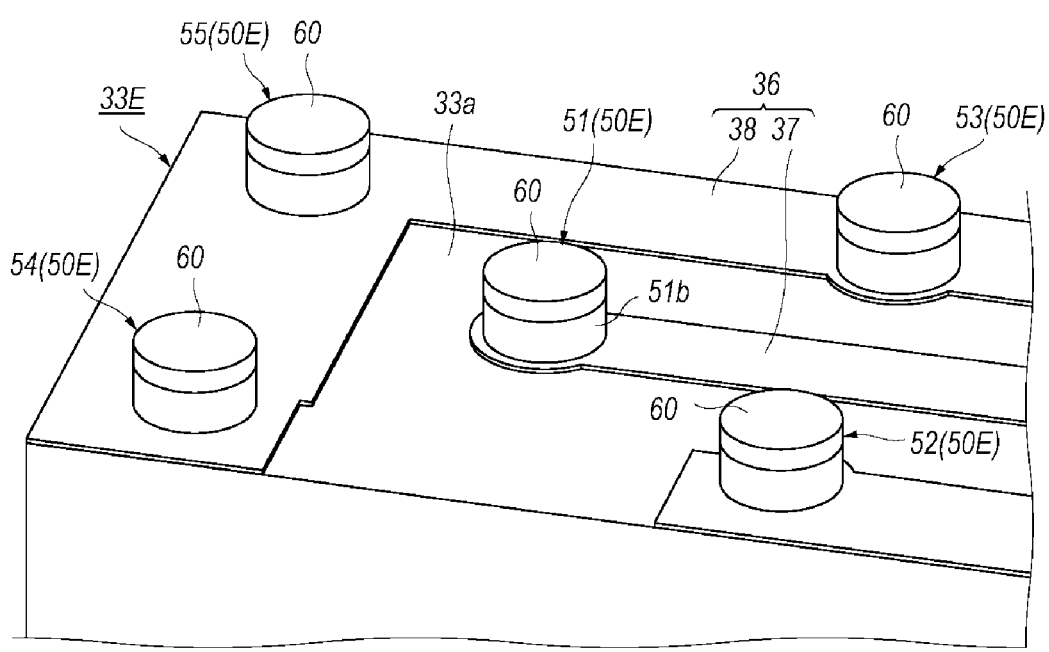
FIG. 17 is a perspective view showing a process of forming the source assembly shown in FIG. 15, which is viewed from the top surface of the bridge substrate.
Figure 18:
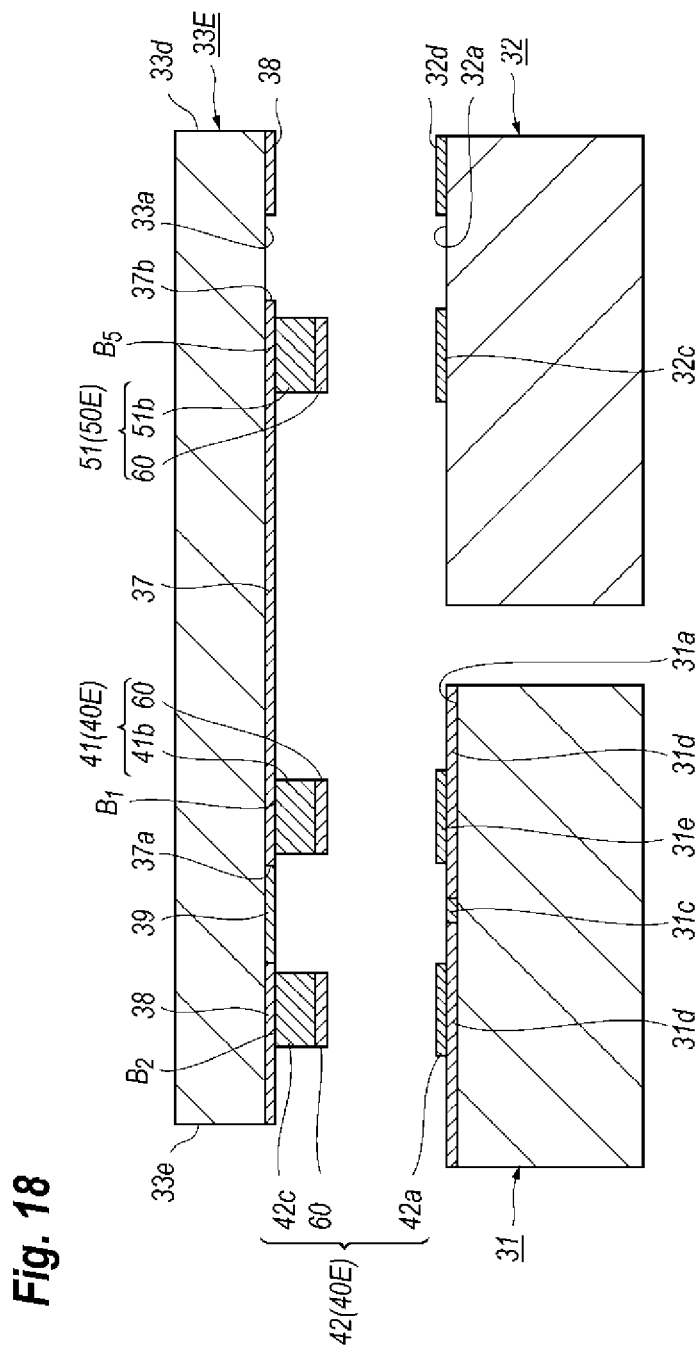
FIG. 18 is a perspective view showing the process subsequent to the process shown in FIG. 17.

Next, a process of forming the source assembly 11 will be described. FIG. 17 and FIG. 18 show steps of the process by respective perspective drawings, where FIG. 17 is a perspective view of the bridge substrate 33E inspecting from the top surface 33a thereof. The process first mounts the EML 31 and the wiring substrate 32 on the carrier 31. Concurrently with, or independent of the mount above, the process may form the posts, 41 to 44 and 51 to 55 on the top surface 33a of the bridge substrate 33E. Plating may fault the metal layers in the posts, 41 to 44 and 51 to 55, on the top surface 33a, while metal evaporation may form the conductive adhesive 60 on the metal layers.

Thereafter, the process mounts the bridge substrate 33 on the EML 31 and the wiring substrate 32. Specifically, as shown in FIG. 18, the bridge substrate 33E may be disposed above the EML 31 and the wiring substrate 32 facing the top surfaces, 31a and 32a, to the other top surface 33a. Placing the bridge substrate 33E onto the EML 31 and the wiring substrate 32 and heating them to a temperature of, for instance, 320° C. to melt the conductive adhesive 60; the source assembly 11 may be formed by lightly pressing the bridge substrate 33E against the EML 31 and the wiring substrate 32 by a pressure of, for instance, 2 N while cooling down the temperature to solidify the conductive adhesive 60.

Figure 19A:
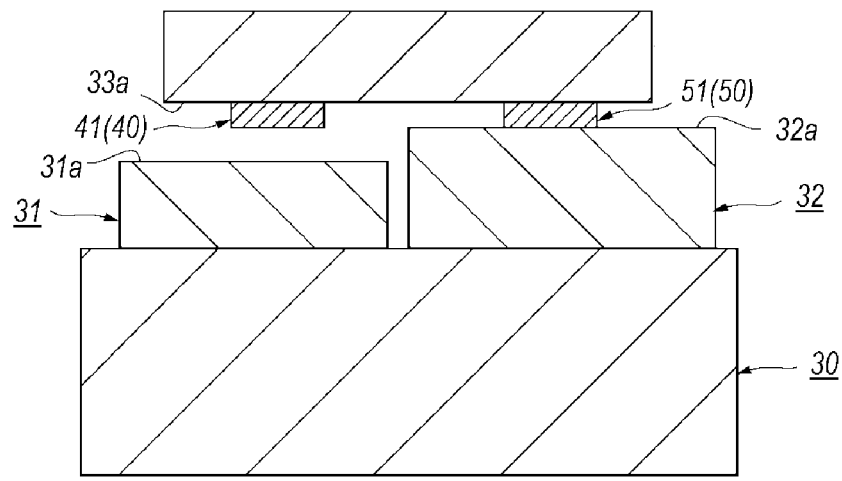
FIG. 19A and FIG. 19B compare processes for forming a source assembly of conventional arrangement with that of the present invention.
Figure 19B:
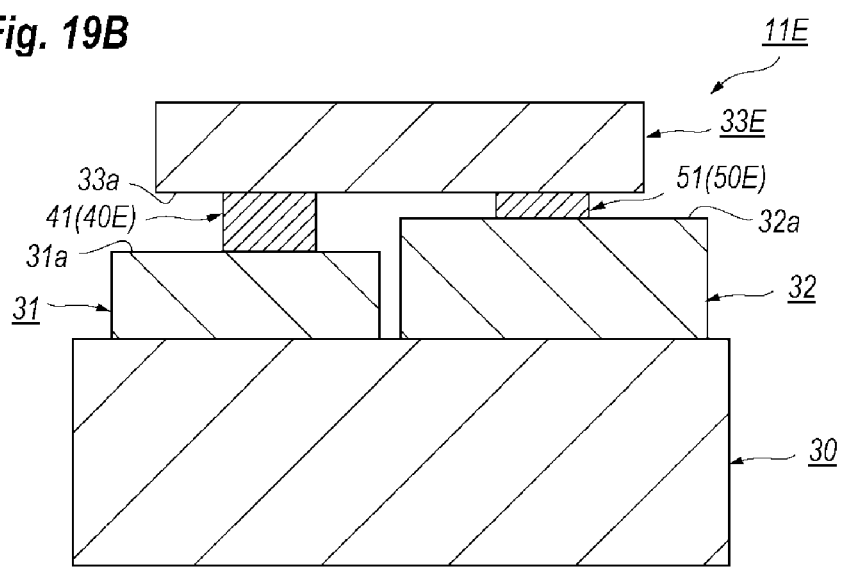

Advantages of the source assembly 11E will be described. FIG. 19A and FIG. 19B compare processes for forming a source assembly of conventional arrangement with that of the present invention, where FIG. 19A and FIG. 19B omits the posts, 42 to 44, in the coupling structure 40 and also the posts, 52 to 55, in the coupling structure 50. FIG. 19A shows a status where the coupling structures, 40 and 50, are not compressed, that is, the posts, 41 and 51, have thicknesses substantially equal to each other and the metal layers provided closest to the top surface 33a of the bridge substrate 33 are not thickened. Under such a condition, tolerances in process conditions and/or in physical dimensions of elements may cause uneven levels in the top surfaces, 31a and 32a, where FIG. 19A shows the level of the top surface 31a of the EML 31 is lowered from the level of the top surface 32a of the wiring substrate 32. Assuming that tolerances in thicknesses of the EML 31 and the wiring substrate 32 are each ±10 µm, a difference between the gaps for the EML 31 and the wiring substrate 32 to the bridge substrate 33 becomes 20 µm at most. Under such a condition, the signal post 41 possibly becomes apart from the top surface 31a of the EML 31.

On the other hand, FIG. 19B shows a status where the signal post 51 is compressed. The signal post 51 has a thickness substantially equal to that of the signal post 41 before the compression; that is, the metal layer provided closest to the bridge substrate 33E is thickened. The signal post 51 becomes thinner than the other signal post 41 after the compression, as shown in FIG. 19B. Accordingly, the signal post 41 may be securely in contact with the top surface 31a of the EML 31. Thus, according to the posts, 41 and 51, of the present embodiment, the bridge substrate 33 may be securely in contact with the EML 31 and the wiring substrate 32 even when tolerances of the physical dimensions of the components cause uneven gaps therebetween. When the tolerances in the physical dimensions make the top level of the wiring substrate 32 lower than the top level of the EML 31, which means that the metal layer provided closest to the bridge substrate 33E may be left thickened, the top levels of the bridge substrate 33E may be leveled by compressing the bridge substrate 33E against the EML 31 and the wiring substrate 32. The ground posts, 42 to 44 and 52 to 55, may show a same function described above to show secure connection between the wiring substrate 32 and the EML 31 through the bridge substrate 33E.

[Sixth Modification]

Figure 20:
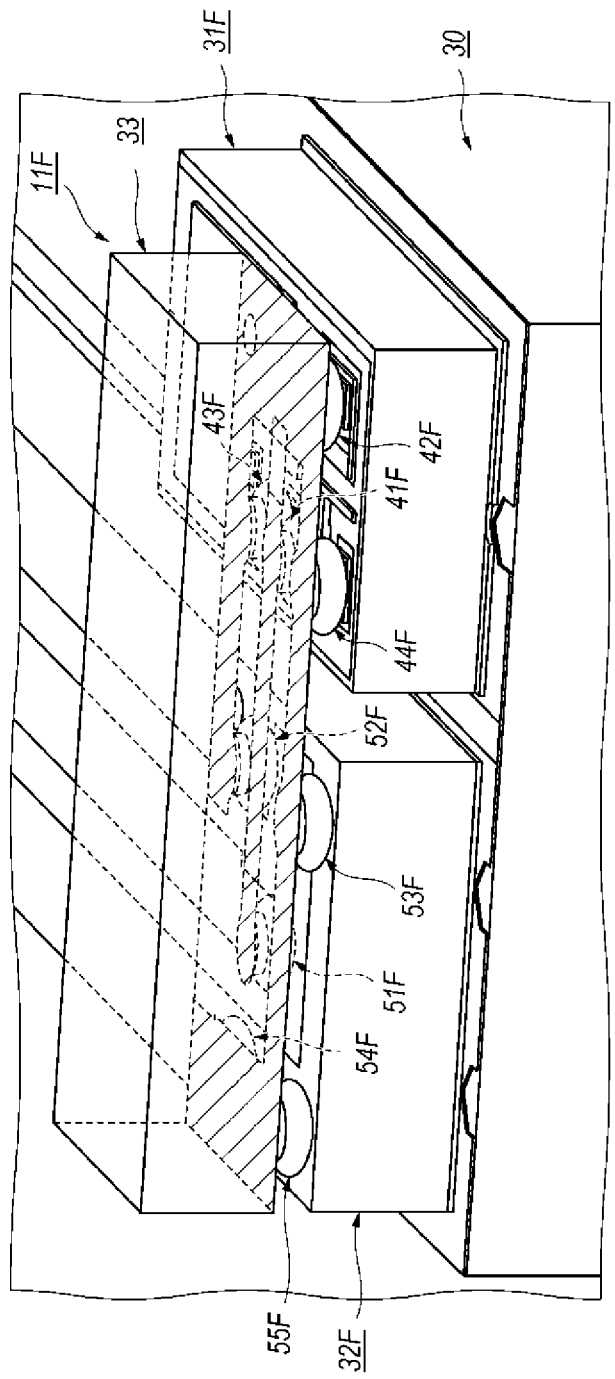
FIG. 20 is a perspective view of the source assembly according to the sixth modification.
Figure 21:
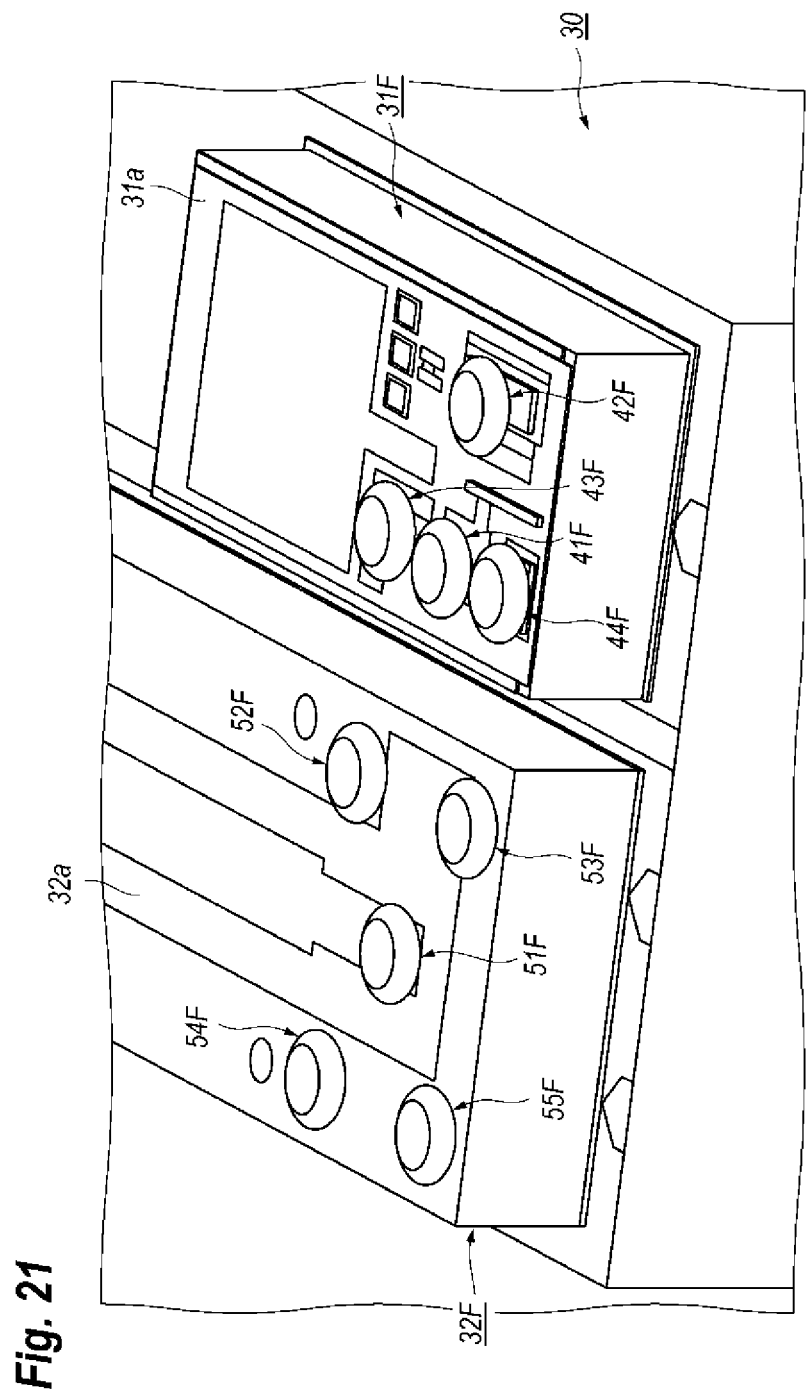
FIG. 21 shows a process of forming the source assembly shown in FIG. 20.

FIG. 20 is a perspective view of the source assembly 11F according to the sixth modification. The source assembly 11F, as shown in FIG. 20, provides the posts, 41F to 44F and 51F to 55F, with a type of ball bump in the side of the top surface 31a of the EML 31F and the top surface 32a of the wiring substrate 32F. In such an arrangement, the conductive adhesive 60 are put between the ball bum and the top surface 33a of the bridge substrate 33. The ball bump, which may be made of gold (Au), is compressed between the top surface 31a of the EML 31F and the top surface 33a of the bridge substrate 33, or between the top surface 32a of the wiring substrate 32F and the top surface 33a of the bridge substrate 33. FIG. 21 shows a process of forming the source assembly 11F of the present modification. The process forms the ball bumps on respective positions on the top surface 31a of the EML 31F, and also on the respective positions on the top surface 32a of the wiring substrate 32F. Then, the bridge substrate 33 is placed on the EML 31F and the wiring substrate 32F affecting a light pressure.

[Seventh Modification]

Figure 22:
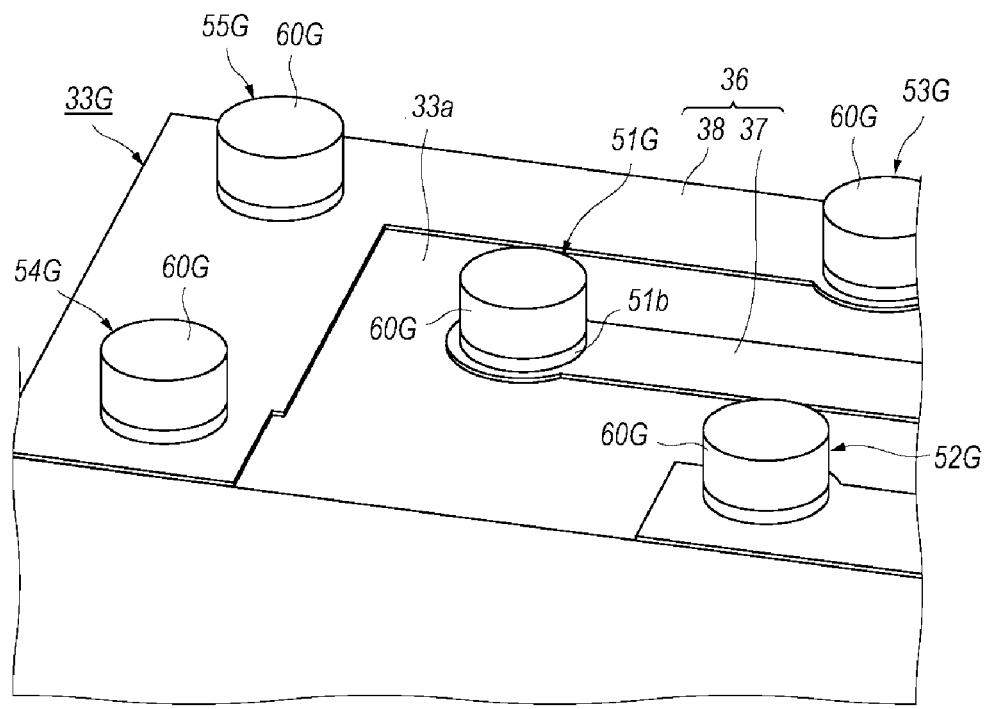
FIG. 22 is a perspective view of the bridge substrate according to the seventh modification of the embodiment.

FIG. 22 is a perspective view of the bridge substrate 33G according to the seventh modification of the present invention. The seventh modification has a feature that the posts, 41G to 44G and 51G to 55G, in respective coupling structures have thickened conductive adhesive 60G but the metal layers involved in the posts, 41G to 44G, and 51G to 55G, each have normal thicknesses. The thickened conductive adhesive 60G may be compressed by light pressure during the assembly of the bridge substrate 33G with the EML 31 and the wiring substrate 32. The thickened conductive adhesive 60G may have thicknesses of 5 to 30 µm, which is 7.6 µm; while, the metal layer in the side of the bridge substrate 33G is 5.6 µm in the present modification. The process of forming those posts, 41G to 44G and 51G to 55G, are substantially same with the process for the source assembly 11E shown in FIG. 15.

[Eighth Modification]

Figure 23:
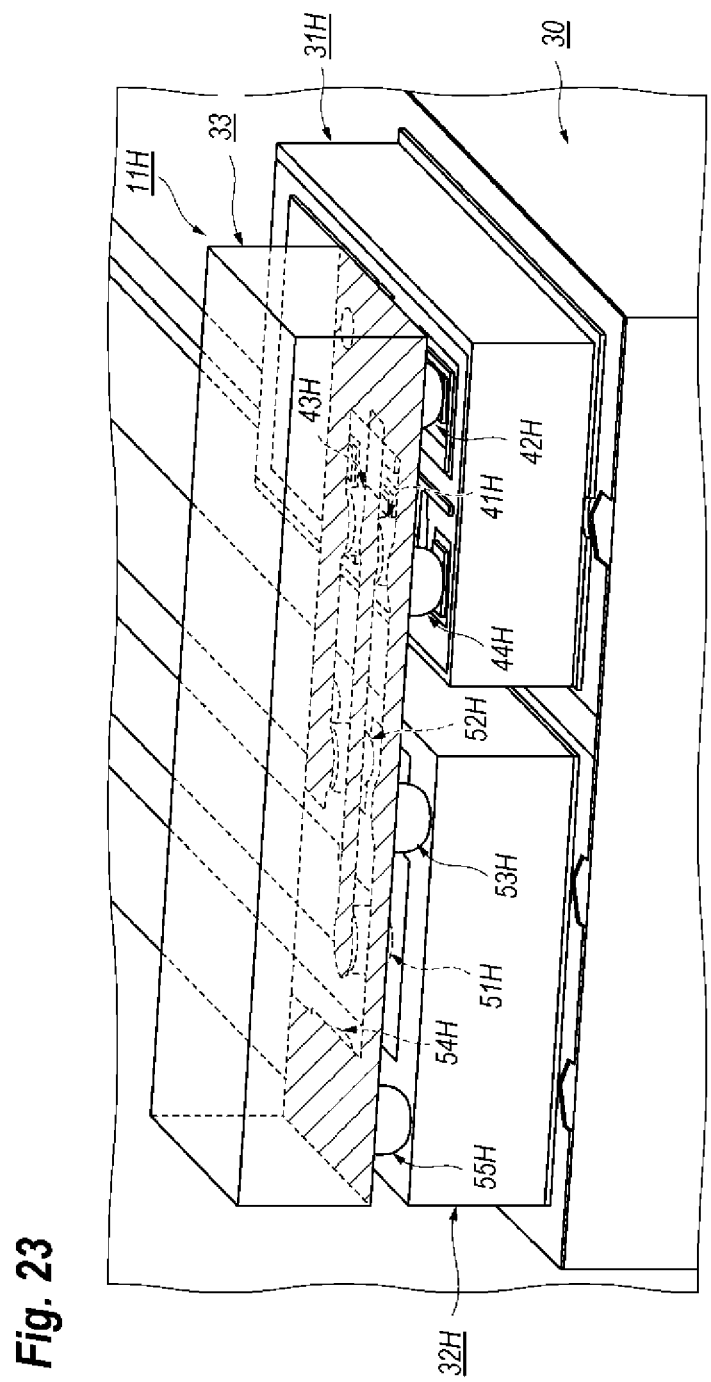
FIG. 23 is a perspective view showing still another source assembly according to the eighth modification of the embodiment.
Figure 24:
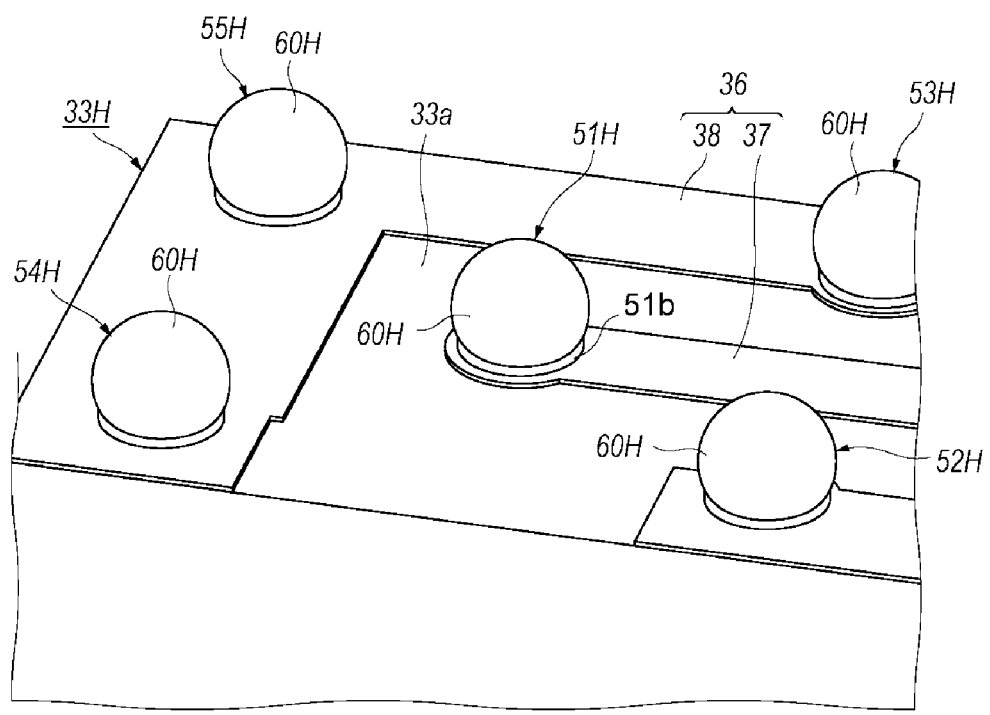
FIG. 24 is a perspective view showing a process of forming the modified bridge substrate shown in FIG. 23.

FIG. 23 is a perspective view showing still another source assembly 11H according to the eighth modification of the embodiment. The thickened conductive adhesive appearing in the former modification may be a type of solder ball. FIG. 24 is a perspective view showing a process of forming the modified bridge substrate 33H of the present modification. The process may form solder balls as the posts, 41H to 44H and 51H to 55H, in respective positions on the top surface 33a of the bridge substrate 33H. Then, similar to the aforementioned process, the bridge substrate 33H is placed on the EML 31 and the wiring substrate 32 causing light pressure thereto.

While particular embodiment of the present invention has been described herein for purposes of illustration, many modifications and changes will become apparent to those skilled in the art. For instance, the embodiment and the modifications thereof may be optionally combined depending on objects and functions thereof. Although the embodiment and the modifications provide the posts with a pillared shape and/or a ball shape, the posts may have another arrangement. Also, the embodiment and the modifications explain that the posts include metals. However, the posts may include another conductive material. Accordingly, the appended claims are intended to encompass all such modifications and changes as fall within the true spirit and scope of this invention.

What is claimed is:

1. An optical module comprising:
    a semiconductor optical device that provides an electrode for an optical modulator and a pad, the electrode receiving a modulation signal through the pad;
    a wiring substrate arranged side by side with respect to the semiconductor optical device, the wiring substrate providing a transmission line carrying the modulation signal to the semiconductor optical device, the transmission line including a signal line and a ground metal surrounding the signal line;
    a bridge substrate that provides a transmission line that includes a signal line carrying the modulation signal to the semiconductor optical device and a ground metal surrounding the signal line of the bridge substrate, the bridge substrate being disposed on the semiconductor optical device and the wiring substrate as the transmission line thereof faces the transmission line of the wiring substrate and the pad of the semiconductor optical device;
    wherein the signal line of the bridge substrate in one end thereof is connected with the pad of the semiconductor optical device and in another end thereof is connected with an end of the signal line in the wiring substrate.

2. The optical module according to claim 1, wherein the bridge substrate provides a terminator between the one end of the signal line of the bridge substrate and the ground metal of the bridge substrate.

3. The optical module according to claim 1, further comprising a coupling structure disposed between the semiconductor optical device and the bridge substrate, wherein the coupling structure levels the bridge substrate with respect to the semiconductor optical device.

4. The optical module according to claim 3,
    wherein the semiconductor optical device provides an insulating film on a top surface thereof that provides the electrode and the pad,
    wherein the coupling structure includes a signal post and ground posts, the signal post being provided between the pad and the signal line of the bridge substrate, the ground posts being provided between the insulating film of the semiconductor optical device and the ground metal and disposed to surround the signal post.

5. The optical module according to claim 4,
    wherein one of the ground posts is disposed in a position extended from the signal line of the bridge substrate, and
    wherein at least two ground posts are disposed in respective positions along a direction perpendicular to the signal line of the bridge substrate.

6. The optical module according to claim 5,
    wherein the semiconductor optical device further includes another pad,
    wherein one of the two ground posts is disposed between the another pad of the semiconductor optical device through an insulating film and an area of the bridge substrate, the area being electrically isolated from the ground metal of bridge substrate, the one of the two ground posts being electrically floated.

7. The optical module according to claim 5,
    wherein the semiconductor optical device further includes a trench and another pad at respective positions on a line virtually extended from the signal line of the bridge substrate, the another pad and the pad sandwiching the trench therebetween, the trench being grounded in the semiconductor optical device and connected with the another pad but isolated from the pad, and
    wherein the one of the ground posts is provided between the another pad and the ground metal of the bridge substrate.

8. The optical module according to claim 5,
    wherein the semiconductor optical device integrates a semiconductor laser diode (LD) with the optical modulator, the optical modulator including the pad, the semiconductor laser diode including the another pad that provides a center portion and a side portion, the center portion including an extended portion protruding from the side portion, and
    wherein one of the at least two ground posts is disposed between the pad and the another pad, and disposed side by side with respect to the extended portion of the another pad.

9. The optical module according to claim 4,
    wherein the signal post and the ground posts include metal layers and a conductive adhesive.

10. The optical module according to claim 3, further comprising another coupling structure provided between the wiring substrate and the bridge substrate,
    wherein the coupling structure provides posts each having heights between the semiconductor optical device and the bridge substrate,
    wherein the another coupling structure provides another posts each having another heights between the wiring substrate and the bridge substrate, and
    wherein the heights attributed to the posts between the semiconductor optical device and the bridge substrate are smaller than the another heights attributed to the another posts between the wiring substrate and the bridge substrate.

11. The optical module according to claim 10,
wherein the posts and the another posts each have a first metal layer and a second metal layer provided between the first metal layer and the bridge substrate,
wherein the first metal layer is thicker than the second metal layer.

12. The optical module according to claim 10,
wherein the posts and the another posts each have a first metal layer and a second metal layer provided between the first metal layer and the bridge substrate, and
wherein the first metal layer is thinner than the second metal layer.

13. The optical module according to claim 3, further comprising another coupling structure provided between the wiring substrate and the bridge substrate,
wherein the coupling structure provides posts each having heights between the semiconductor optical device and the bridge substrate,
wherein the another coupling structure provides another posts each having another heights between the wiring substrate and the bridge substrate, and
wherein the another heights attributed to the another posts between the wiring substrate and the bridge substrate are smaller than the heights attributed to the posts between the semiconductor optical device and the bridge substrate.

14. The optical module according to claim 13,
wherein the posts and the another posts each have a first metal layer and a second metal layer provided between the first metal layer and the top surface of the bridge substrate,
wherein the first metal layer is thicker than the second metal layer.

15. The optical module according to claim 13,
wherein the posts and the another posts have a first metal layer and a second metal layer provided between the first metal layer and the bridge substrate, and
wherein the first metal layer is thinner than the second metal layer.

16. The optical module according to claim 1, further comprising another coupling structure provided between the wiring substrate and the bridge substrate,
wherein the another coupling structure includes a signal post and a plurality of ground posts, the signal post being provided between the another end of the signal line of the bride substrate and the signal line of the wiring substrate, the ground posts being provided between the ground metal of the bridge substrate and the ground metal of the wiring substrate,
wherein the ground posts surround the signal post.

* * * * *